(12) United States Patent
Berkovich et al.

(10) Patent No.: US 10,969,273 B2
(45) Date of Patent: Apr. 6, 2021

(54) ANALOG-TO-DIGITAL CONVERTER HAVING PROGRAMMABLE QUANTIZATION RESOLUTION

(71) Applicant: Facebook Technologies, LLC, Menlo Park, CA (US)

(72) Inventors: Andrew Samuel Berkovich, Bellevue, WA (US); Xinqiao Liu, Medina, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 119 days.

(21) Appl. No.: 16/249,420

(22) Filed: Jan. 16, 2019

(65) Prior Publication Data

US 2019/0285468 A1    Sep. 19, 2019

Related U.S. Application Data

(60) Provisional application No. 62/644,997, filed on Mar. 19, 2018.

(51) Int. Cl.
   *G01J 1/44* (2006.01)
   *H04N 5/3745* (2011.01)
   *G01J 1/42* (2006.01)

(52) U.S. Cl.
   CPC ............... *G01J 1/44* (2013.01); *G01J 1/4204* (2013.01); *H04N 5/37455* (2013.01); *G01J 2001/4413* (2013.01)

(58) Field of Classification Search
   CPC .... G01J 1/44; G01J 1/4204; G01J 2001/4413; G01J 1/46; H04N 5/37455; H04N 5/355;
   (Continued)

(56) References Cited

U.S. PATENT DOCUMENTS

| 4,596,977 A | 6/1986 | Bauman et al. |
| 5,053,771 A | 10/1991 | McDermott |

(Continued)

FOREIGN PATENT DOCUMENTS

| DE | 202016105510 | 10/2016 |
| EP | 0675345 | 10/1995 |

(Continued)

OTHER PUBLICATIONS

U.S. Appl. No. 15/847,517, "Non-Final Office Action", dated Nov. 23, 2018, 21 pages.

(Continued)

*Primary Examiner* — Seung C Sohn
(74) *Attorney, Agent, or Firm* — Kilpatrick Townsend & Stockton

(57) ABSTRACT

Methods and systems for performing analog-to-digital conversion are proposed. In one example, An analog-to-digital converter (ADC) comprising a quantizer, the quantizer having a first quantization resolution for a first quantization operation subrange and a second quantization resolution for a second quantization operation subrange. At least one of the first quantization resolution or the first quantization operation subrange is programmable. At least one of the second quantization resolution or the second quantization operation subrange is programmable. The quantizer is configured to: receive an input voltage; and based on whether the input voltage belongs to the first quantization operation subrange or to the second quantization operation subrange, quantize the input voltage at the first quantization resolution or at the second quantization resolution to generate a digital output.

21 Claims, 26 Drawing Sheets

(58) Field of Classification Search
CPC ........ H03M 1/1235; H03M 1/56; H03M 1/00;
G02B 27/0081; G02B 2027/0138; G02B
2027/0178; G02B 27/0172
USPC .................................................. 250/214 DC
See application file for complete search history.

(56) References Cited

U.S. PATENT DOCUMENTS

| | | | |
|---|---|---|---|
| 5,844,512 A * | 12/1998 | Gorin | H03M 1/0629 |
| | | | 341/139 |
| 6,522,395 B1 | 2/2003 | Bamji et al. | |
| 6,529,241 B1 | 3/2003 | Clark | |
| 6,864,817 B1 * | 3/2005 | Salvi | H03M 3/49 |
| | | | 341/139 |
| 7,659,772 B2 | 2/2010 | Nomura et al. | |
| 7,719,589 B2 | 5/2010 | Turchetta et al. | |
| 8,134,623 B2 | 3/2012 | Purcell et al. | |
| 8,144,227 B2 | 3/2012 | Kobayashi | |
| 8,369,458 B2 * | 2/2013 | Wong | H04B 1/16 |
| | | | 375/340 |
| 8,426,793 B1 | 4/2013 | Barrows | |
| 8,754,798 B2 | 6/2014 | Lin | |
| 8,773,562 B1 | 7/2014 | Fan | |
| 8,779,346 B2 | 7/2014 | Fowler et al. | |
| 8,946,610 B2 | 2/2015 | Iwabuchi et al. | |
| 9,094,629 B2 | 7/2015 | Ishibashi | |
| 9,185,273 B2 | 11/2015 | Beck et al. | |
| 9,274,151 B2 | 3/2016 | Lee et al. | |
| 9,332,200 B1 | 5/2016 | Hseih et al. | |
| 9,343,497 B2 | 5/2016 | Cho | |
| 9,363,454 B2 | 6/2016 | Ito et al. | |
| 9,478,579 B2 | 10/2016 | Dai et al. | |
| 9,497,396 B2 | 11/2016 | Choi | |
| 9,531,990 B1 | 12/2016 | Wilkins et al. | |
| 9,800,260 B1 | 10/2017 | Banerjee | |
| 9,819,885 B2 | 11/2017 | Furukawa et al. | |
| 9,909,922 B2 | 3/2018 | Schweickert et al. | |
| 9,948,316 B1 | 4/2018 | Yun et al. | |
| 9,967,496 B2 | 5/2018 | Ayers et al. | |
| 10,003,759 B2 | 6/2018 | Fan | |
| 10,015,416 B2 | 7/2018 | Borthakur et al. | |
| 10,419,701 B2 | 9/2019 | Liu | |
| 10,574,925 B2 | 2/2020 | Otaka | |
| 10,598,546 B2 | 3/2020 | Liu | |
| 10,608,101 B2 | 3/2020 | Liu | |
| 10,686,996 B2 | 6/2020 | Liu | |
| 2002/0067303 A1 | 6/2002 | Lee et al. | |
| 2003/0020100 A1 | 1/2003 | Guidash | |
| 2003/0049925 A1 | 3/2003 | Layman et al. | |
| 2004/0095495 A1 | 5/2004 | Inokuma et al. | |
| 2004/0251483 A1 | 12/2004 | Ko et al. | |
| 2005/0057389 A1 | 3/2005 | Krymski | |
| 2005/0104983 A1 | 5/2005 | Raynor | |
| 2005/0280727 A1 | 12/2005 | Sato et al. | |
| 2006/0023109 A1 | 2/2006 | Mabuchi et al. | |
| 2006/0158541 A1 | 7/2006 | Ichikawa | |
| 2007/0013983 A1 | 1/2007 | Kitamura et al. | |
| 2007/0076481 A1 | 4/2007 | Tennant | |
| 2007/0092244 A1 | 4/2007 | Pertsel et al. | |
| 2007/0102740 A1 | 5/2007 | Ellis-Monaghan et al. | |
| 2007/0131991 A1 | 6/2007 | Sugawa | |
| 2007/0208526 A1 | 9/2007 | Staudt et al. | |
| 2007/0222881 A1 | 9/2007 | Mentzer | |
| 2008/0001065 A1 | 1/2008 | Ackland | |
| 2008/0068478 A1 | 3/2008 | Watanabe | |
| 2008/0088014 A1 | 4/2008 | Adkisson et al. | |
| 2008/0191791 A1 | 8/2008 | Nomura et al. | |
| 2008/0226183 A1 | 9/2008 | Lei et al. | |
| 2009/0002528 A1 | 1/2009 | Manabe et al. | |
| 2009/0091645 A1 | 4/2009 | Trimeche et al. | |
| 2009/0128640 A1 | 5/2009 | Yumiki | |
| 2009/0224139 A1 | 9/2009 | Buettgen et al. | |
| 2009/0261235 A1 | 10/2009 | Lahav et al. | |
| 2010/0013969 A1 | 1/2010 | Ui | |
| 2010/0140732 A1 | 6/2010 | Eminoglu et al. | |
| 2010/0276572 A1 | 11/2010 | Iwabuchi et al. | |
| 2011/0049589 A1 | 3/2011 | Chuang et al. | |
| 2011/0149116 A1 | 6/2011 | Kim | |
| 2011/0254986 A1 | 10/2011 | Nishimura et al. | |
| 2012/0039548 A1 | 2/2012 | Wang et al. | |
| 2012/0068051 A1 | 3/2012 | Ahn et al. | |
| 2012/0092677 A1 | 4/2012 | Suehira et al. | |
| 2012/0127284 A1 | 5/2012 | Bar-Zeev et al. | |
| 2012/0133807 A1 | 5/2012 | Wu et al. | |
| 2012/0138775 A1 | 6/2012 | Cheon et al. | |
| 2012/0153123 A1 | 6/2012 | Mao et al. | |
| 2012/0188420 A1 | 7/2012 | Black et al. | |
| 2012/0241591 A1 | 9/2012 | Wan et al. | |
| 2012/0262616 A1 | 10/2012 | Sa et al. | |
| 2012/0267511 A1 | 10/2012 | Kozlowski | |
| 2012/0273654 A1 | 11/2012 | Hynecek et al. | |
| 2013/0020466 A1 | 1/2013 | Ayers et al. | |
| 2013/0056809 A1 | 3/2013 | Mao et al. | |
| 2013/0057742 A1 | 3/2013 | Nakamura et al. | |
| 2013/0082313 A1 | 4/2013 | Manabe | |
| 2013/0113969 A1 | 5/2013 | Manabe et al. | |
| 2013/0126710 A1 | 5/2013 | Kondo | |
| 2013/0141619 A1 | 6/2013 | Lim et al. | |
| 2013/0207219 A1 | 8/2013 | Ann | |
| 2013/0214371 A1 | 8/2013 | Asatsuma et al. | |
| 2013/0229543 A1 | 9/2013 | Hashimoto et al. | |
| 2013/0229560 A1 | 9/2013 | Kondo | |
| 2013/0234029 A1 | 9/2013 | Bikumandla | |
| 2013/0293752 A1 | 11/2013 | Peng et al. | |
| 2013/0299674 A1 | 11/2013 | Fowler et al. | |
| 2014/0021574 A1 | 1/2014 | Egawa | |
| 2014/0042299 A1 | 2/2014 | Wan et al. | |
| 2014/0042582 A1 | 2/2014 | Kondo | |
| 2014/0085523 A1 | 3/2014 | Hynecek | |
| 2014/0176770 A1 | 6/2014 | Kondo | |
| 2014/0211052 A1 | 7/2014 | Choi | |
| 2014/0232890 A1 | 8/2014 | Yoo et al. | |
| 2014/0306276 A1 | 10/2014 | Yamaguchi | |
| 2015/0083895 A1 | 3/2015 | Hashimoto et al. | |
| 2015/0090863 A1 | 4/2015 | Mansoorian et al. | |
| 2015/0172574 A1 | 6/2015 | Honda et al. | |
| 2015/0189209 A1 | 7/2015 | Yang et al. | |
| 2015/0208009 A1 | 7/2015 | Oh et al. | |
| 2015/0229859 A1 | 8/2015 | Guidash et al. | |
| 2015/0237274 A1 | 8/2015 | Yang et al. | |
| 2015/0279884 A1 | 10/2015 | Kusumoto | |
| 2015/0287766 A1 | 10/2015 | Kim et al. | |
| 2015/0312502 A1 | 10/2015 | Borremans | |
| 2015/0350582 A1 | 12/2015 | Korobov et al. | |
| 2015/0358569 A1 | 12/2015 | Egawa | |
| 2015/0358593 A1 | 12/2015 | Sato | |
| 2015/0381907 A1 | 12/2015 | Boettiger et al. | |
| 2016/0028974 A1 | 1/2016 | Guidash et al. | |
| 2016/0028980 A1 | 1/2016 | Kameyama et al. | |
| 2016/0037111 A1 | 2/2016 | Dai et al. | |
| 2016/0088253 A1 | 3/2016 | Tezuka | |
| 2016/0100115 A1 | 4/2016 | Kusano | |
| 2016/0111457 A1 | 4/2016 | Sekine | |
| 2016/0112626 A1 | 4/2016 | Shimada | |
| 2016/0118992 A1 | 4/2016 | Milkov | |
| 2016/0165160 A1 | 6/2016 | Hseih et al. | |
| 2016/0204150 A1 | 7/2016 | Oh et al. | |
| 2016/0240570 A1 | 8/2016 | Barna et al. | |
| 2016/0249004 A1 | 8/2016 | Saeki et al. | |
| 2016/0307945 A1 | 10/2016 | Madurawe | |
| 2016/0337605 A1 | 11/2016 | Ito | |
| 2016/0353045 A1 | 12/2016 | Kawahito et al. | |
| 2016/0360127 A1 | 12/2016 | Dierickx et al. | |
| 2017/0013215 A1 | 1/2017 | McCarten | |
| 2017/0053962 A1 | 2/2017 | Oh et al. | |
| 2017/0062501 A1 | 3/2017 | Velichko et al. | |
| 2017/0069363 A1 | 3/2017 | Baker | |
| 2017/0099446 A1 | 4/2017 | Cremers et al. | |
| 2017/0104021 A1 | 4/2017 | Park et al. | |
| 2017/0104946 A1 | 4/2017 | Hong | |
| 2017/0111600 A1 | 4/2017 | Wang et al. | |
| 2017/0141147 A1 | 5/2017 | Raynor | |
| 2017/0170223 A1 | 6/2017 | Hynecek et al. | |
| 2017/0207268 A1 | 7/2017 | Kurokawa | |

(56) References Cited

U.S. PATENT DOCUMENTS

| | | | |
|---|---|---|---|
| 2017/0346579 A1 | 11/2017 | Barghi | |
| 2017/0359497 A1 | 12/2017 | Mandelli et al. | |
| 2017/0366766 A1 | 12/2017 | Geurts et al. | |
| 2018/0019269 A1 | 1/2018 | Klipstein | |
| 2018/0077368 A1 | 3/2018 | Suzuki | |
| 2018/0152650 A1 | 5/2018 | Sakakibara et al. | |
| 2018/0220093 A1 | 8/2018 | Murao et al. | |
| 2018/0376046 A1 | 12/2018 | Liu | |
| 2019/0052788 A1 | 2/2019 | Liu | |
| 2019/0056264 A1 | 2/2019 | Liu | |
| 2019/0057995 A1 | 2/2019 | Liu | |
| 2019/0058058 A1 | 2/2019 | Liu | |
| 2019/0104263 A1 | 4/2019 | Ochiai et al. | |
| 2019/0104265 A1 | 4/2019 | Totsuka et al. | |
| 2019/0157330 A1 | 5/2019 | Sato et al. | |
| 2019/0172868 A1 | 6/2019 | Chen et al. | |
| 2019/0335151 A1* | 10/2019 | Rivard | H04N 9/09 |
| 2019/0348460 A1 | 11/2019 | Chen et al. | |
| 2019/0355782 A1 | 11/2019 | Do et al. | |
| 2019/0379827 A1 | 12/2019 | Berkovich et al. | |
| 2020/0007800 A1 | 1/2020 | Berkovich et al. | |
| 2020/0068189 A1 | 2/2020 | Chen et al. | |

FOREIGN PATENT DOCUMENTS

| | | |
|---|---|---|
| EP | 1681856 | 7/2006 |
| EP | 1732134 | 12/2006 |
| EP | 1746820 A1 | 1/2007 |
| EP | 2063630 | 5/2009 |
| EP | 2538664 | 12/2012 |
| EP | 2833619 | 2/2015 |
| EP | 3032822 | 6/2016 |
| EP | 3258683 | 12/2017 |
| EP | 3425352 | 1/2019 |
| KR | 100574959 | 4/2006 |
| KR | 20110050351 | 5/2011 |
| KR | 20150095841 | 8/2015 |
| KR | 20160008287 | 1/2016 |
| WO | 2017058488 | 4/2017 |
| WO | 2017069706 | 4/2017 |
| WO | 2017169882 | 10/2017 |
| WO | 2019168929 | 9/2019 |

OTHER PUBLICATIONS

Cho, et al., "A Low Power Dual CDS for a Column-Parallel CMOS Image Sensor", Journal of Semiconductor Technology and Science, vol. 12, No. 4, Dec. 30, 2012, pp. 388-396.
European Application No. EP18179838.0, "Partial European Search Report", dated Dec. 5, 2018, 14 pages.
European Application No. EP18179846.3, "Extended European Search Report", dated Dec. 7, 2018, 10 pages.
European Application No. EP18179851.3, "Extended European Search Report", dated Dec. 7, 2018, 10 pages.
International Application No. PCT/US2018/039350, "International Search Report and Written Opinion", dated Nov. 15, 2018, 13 pages.
International Application No. PCT/US2018/039352, "International Search Report and Written Opinion", dated Oct. 26, 2018, 10 pages.
International Application No. PCT/US2018/039431, "International Search Report and Written Opinion", dated Nov. 7, 2018, 14 pages.
PCT/US2019/014044, "International Search Report and Written Opinion", dated May 8, 2019, 11 pages.
U.S. Appl. No. 15/719,345, "Notice of Allowance", dated Sep. 3, 2020, 12 pages.
U.S. Appl. No. 16/454,787, "Notice of Allowance", dated Sep. 9, 2020, 9 pages.
U.S. Appl. No. 16/707,988, "Non-Final Office Action", dated Sep. 22, 2020, 15 pages.
U.S. Appl. No. 15/668,241, Advisory Action, dated Oct. 23, 2019, 5 pages.
U.S. Appl. No. 15/668,241, Final Office Action, dated Jun. 17, 2019, 19 pages.
U.S. Appl. No. 15/668,241, Non-Final Office Action, dated Dec. 21, 2018, 3 pages.
U.S. Appl. No. 15/668,241, Notice of Allowance, dated Jun. 29, 2020, 8 pages.
U.S. Appl. No. 15/668,241, Notice of Allowance, dated Mar. 5, 2020, 8 pages.
U.S. Appl. No. 15/668,241, "Supplemental Notice of Allowability", dated Apr. 29, 2020, 5 pages.
U.S. Appl. No. 15/719,345, Final Office Action, dated Apr. 29, 2020, 14 pages.
U.S. Appl. No. 15/719,345, Non-Final Office Action, dated Nov. 25, 2019, 14 pages.
U.S. Appl. No. 15/719,345, Notice of Allowance, dated Aug. 12, 2020, 11 pages.
U.S. Appl. No. 15/801,216, Advisory Action, dated Apr. 7, 2020, 3 pages.
U.S. Appl. No. 15/801,216, Final Office Action, dated Dec. 26, 2019, 5 pages.
U.S. Appl. No. 15/801,216, Non-Final Office Action, dated Jun. 27, 2019, 13 pages.
U.S. Appl. No. 15/801,216, Notice of Allowance, dated Jun. 23, 2020, 5 pages.
U.S. Appl. No. 15/847,517, Notice of Allowance, dated May 1, 2019, 11 pages.
U.S. Appl. No. 15/861,588, Non-Final Office Action, dated Jul. 10, 2019, 11 pages.
U.S. Appl. No. 15/861,588, Notice of Allowance, dated Nov. 26, 2019, 9 pages.
U.S. Appl. No. 15/876,061, "Corrected Notice of Allowability", dated Apr. 28, 2020, 3 pages.
U.S. Appl. No. 15/876,061, Non-Final Office Action, dated Sep. 18, 2019, 23 pages.
U.S. Appl. No. 15/876,061, "Notice of Allowability", dated May 6, 2020, 2 pages.
U.S. Appl. No. 15/876,061, Notice of Allowance, dated Feb. 4, 2020, 13 pages.
U.S. Appl. No. 15/927,896, Non-Final Office Action, dated May 1, 2019, 10 pages.
U.S. Appl. No. 15/983,379, Notice of Allowance, dated Oct. 18, 2019, 9 pages.
U.S. Appl. No. 15/983,391, Non-Final Office Action, dated Aug. 29, 2019, 12 pages.
U.S. Appl. No. 15/983,391, Notice of Allowance, dated Apr. 8, 2020, 8 pages.
U.S. Appl. No. 16/177,971, Final Office Action, dated Feb. 27, 2020, 9 pages.
U.S. Appl. No. 16/177,971, Non-Final Office Action, dated Sep. 25, 2019, 9 pages.
U.S. Appl. No. 16/177,971, Notice of Allowance, dated Apr. 24, 2020, 6 pages.
U.S. Appl. No. 16/210,748, Final Office Action, dated Jul. 7, 2020, 11 pages.
U.S. Appl. No. 16/210,748, Non-Final Office Action, dated Jan. 31, 2020, 11 pages.
U.S. Appl. No. 16/286,355, Non-Final Office Action, dated Oct. 1, 2019, 6 pages.
U.S. Appl. No. 16/286,355, Notice of Allowance, dated Feb. 12, 2020, 7 pages.
U.S. Appl. No. 16/286,355, Notice of Allowance, dated Jun. 4, 2020, 7 pages.
U.S. Appl. No. 16/369,763, Non-Final Office Action, dated Jul. 22, 2020, 15 pages.
U.S. Appl. No. 16/382,015, Notice of Allowance, dated Jun. 11, 2020, 11 pages.
U.S. Appl. No. 16/384,720, Non-Final Office Action, dated May 1, 2020, 6 pages.
U.S. Appl. No. 16/431,693, Non-Final Office Action, dated Jan. 30, 2020, 6 pages.
U.S. Appl. No. 16/431,693, Notice of Allowance, dated Jun. 24, 2020, 7 pages.
U.S. Appl. No. 16/435,449, Notice of Allowance, dated Jul. 27, 2020, 8 pages.

(56) References Cited

OTHER PUBLICATIONS

U.S. Appl. No. 16/436,049, Non-Final Office Action, dated Jun. 30, 2020, 11 pages.
U.S. Appl. No. 16/436,049, Non-Final Office Action, dated Mar. 4, 2020, 9 pages.
U.S. Appl. No. 16/454,787, Notice of Allowance, dated Apr. 22, 2020, 10 pages.
U.S. Appl. No. 16/454,787, Notice of Allowance, dated Jul. 9, 2020, 9 pages.
U.S. Appl. No. 16/566,583, Final Office Action, dated Apr. 15, 2020, 24 pages.
U.S. Appl. No. 16/566,583, Non-Final Office Action, dated Oct. 1, 2019, 10 pages.
U.S. Appl. No. 16/566,583, Non-Final Office Action, dated Jul. 27, 2020, 11 pages.
Application No. EP18179838.0, Extended European Search Report, dated May 24, 2019, 17 pages.
Application No. EP18188684.7, Extended European Search Report, dated Jan. 16, 2019, 10 pages.
Application No. EP18188684.7, Office Action, dated Nov. 26, 2019, 9 pages.
Application No. EP18188962.7, Extended European Search Report, dated Oct. 23, 2018, 8 pages.
Application No. EP18188962.7, Office Action, dated Aug. 28, 2019, 6 pages.
Application No. EP18188968.4, Extended European Search Report, dated Oct. 23, 2018, 8 pages.
Application No. EP18188968.4, Office Action, dated Aug. 14, 2019, 5 pages.
Application No. EP18189100.3, Extended European Search Report, dated Oct. 9, 2018, 8 pages.
Kavusi et al., "Quantitative Study of High-Dynamic-Range Image Sensor Architectures", Proceedings of Society of Photo-Optical Instrumentation Engineers—The International Society for Optical Engineering, vol. 5301, Jun. 2004, pp. 264-275.
Application No. PCT/US2018/039350, International Preliminary Report on Patentability, dated Jan. 9, 2020, 10 pages.
Application No. PCT/US2018/045661, International Search Report and Written Opinion, dated Nov. 30, 2018, 11 Pages.
Application No. PCT/US2018/045666, International Preliminary Report on Patentability, dated Feb. 27, 2020, 11 pages.
Application No. PCT/US2018/045666, International Search Report and Written Opinion, dated Dec. 3, 2018, 13 pages.
Application No. PCT/US2018/045673, International Search Report and Written Opinion, dated Dec. 4, 2018, 13 pages.
Application No. PCT/US2018/046131, International Search Report and Written Opinion, dated Dec. 3, 2018, 10 pages.
Application No. PCT/US2018/064181, International Preliminary Report on Patentability, dated Jun. 18, 2020, 9 pages.
Application No. PCT/US2018/064181, International Search Report and Written Opinion, dated Mar. 29, 2019, 12 pages.
Application No. PCT/US2019/019756, International Search Report and Written Opinion, dated Jun. 13, 2019, 11 pages.
Application No. PCT/US2019/025170, International Search Report and Written Opinion, dated Jul. 9, 2019, 11 pages.
Application No. PCT/US2019/027727, International Search Report and Written Opinion, dated Jun. 27, 2019, 11 pages.
Application No. PCT/US2019/027729, International Search Report and Written Opinion, dated Jun. 27, 2019, 10 pages.
Application No. PCT/US2019/031521, International Search Report and Written Opinion, dated Jul. 11, 2019, 11 pages.
Application No. PCT/US2019/035724, International Search Report and Written Opinion, dated Sep. 10, 2019, 12 pages.
Application No. PCT/US2019/036484, International Search Report and Written Opinion, dated Sep. 19, 2019, 10 pages.
Application No. PCT/US2019/036492, International Search Report and Written Opinion, dated Sep. 25, 2019, 9 pages.
Application No. PCT/US2019/036536, International Search Report and Written Opinion, dated Sep. 26, 2019, 14 pages.
Application No. PCT/US2019/036575, International Search Report and Written Opinion, dated Sep. 30, 2019, 16 pages.
Application No. PCT/US2019/039410, International Search Report and Written Opinion, dated Sep. 30, 2019, 11 pages.
Application No. PCT/US2019/039758, International Search Report and Written Opinion, dated Oct. 11, 2019, 13 pages.
Application No. PCT/US2019/047156, International Search Report and Written Opinion, dated Oct. 23, 2019, 9 pages.
Application No. PCT/US2019/048241, International Search Report and Written Opinion, dated Jan. 28, 2020, 16 pages.
Application No. PCT/US2019/049756, International Search Report and Written Opinion, dated Dec. 16, 2019, 8 pages.
Application No. PCT/US2019/059754, International Search Report and Written Opinion, dated Mar. 24, 2020, 15 pages.
Application No. PCT/US2019/065430, International Search Report and Written Opinion, dated Mar. 6, 2020, 15 pages.
Snoeij, "A Low Power Column-Parallel 12-Bit ADC for CMOS Imagers", Institute of Electrical and Electronics Engineers Workshop on Charge-Coupled Devices and Advanced Image Sensors, Jun. 2005, pp. 169-172.
Tanner et al., "Low-Power Digital Image Sensor for Still Picture Image Acquisition", Visual Communications and Image Processing, vol. 4306, Jan. 22, 2001, 8 pages.
Xu et al., "A New Digital-Pixel Architecture for CMOS Image Sensor With Pixel-Level ADC and Pulse Width Modulation using a 0.18 Mu M CMOS Technology", Institute of Electrical and Electronics Engineers Conference on Electron Devices and Solid-State Circuits, Dec. 16-18, 2003, pp. 265-268.

\* cited by examiner

ANALOG-TO-DIGITAL CONVERTER HAVING PROGRAMMABLE QUANTIZATION RESOLUTION

RELATED APPLICATION

This patent application claims priority to U.S. Provisional Patent Application Ser. No. 62/644,997, filed Mar. 19, 2018, entitled "DIGITAL PROGRAMMABLE ADC," which is assigned to the assignee hereof and is incorporated herein by reference in its entirety for all purposes.

BACKGROUND

The disclosure relates generally to analog-to-digital conversion, and more specifically to an analog-to-digital converter (ADC) having one or more programmable quantization resolutions.

Analog-to-digital conversion generally refers to generating a digital representation of an analog signal by an analog-to-digital converter (ADC). Analog-to-digital conversion can be performed for various reasons. For example, the digital representation can be generated for transmission, storage, and/or for subsequent processing (e.g., filtering), both of which can be more easily and reliably performed in digital domain than in analog domain. For example, the transmission of digital information over a bus, as well as the storage of digital information in a memory device, is more reliable and are less susceptible to the effect of charge leakage and noise than the transmission and storage of an analog voltage. Also, the processing of digital information can be performed based on various digital signal processing algorithms using a hardware processor, such as a digital signal processor (DSP), which typically is much more compact and requires much less power than the analog circuits (e.g., operational amplifiers, passive devices such as resisters, capacitors, and inductors) needed to implement similar processing in the analog domain.

ADC can be found in many applications, such as image processing. For example, an image sensor, such as a pixel cell, may include a photodiode to sense incident light by converting photons into charges (e.g., electrons or holes). The image sensor further includes a floating node configured as a capacitor to collect the charges generated by the photodiode during an exposure period. The collected charges can develop an analog voltage at the capacitor. The analog voltage can be buffered and fed to an ADC, which can quantize the analog voltage into a digital value representing the intensity of the incident light received at the photodiode. An image of a scene can be obtained based on the digital values generated by multiple pixel cells, with each digital value corresponding to incident light received from part of the scene. The digital values of the image can also be stored and post-processed for different applications.

There can be a difference between an analog voltage and its quantized value. The difference leads to quantization error. The quantization errors between the analog voltages (which are developed from the accumulated charges in the image sensors) and their quantized values can add noise to the image and degrade the fidelity of representation of the scene by the image. The quantization errors can be reduced by increasing the quantization resolution of the ADC.

SUMMARY

The present disclosure relates to analog-to-digital conversion. More specifically, and without limitation, this disclosure relates to an analog-to-digital converter (ADC) having one or more programmable quantization resolutions. This disclosure also relates to an image sensor that includes one or more ADCs having one or more programmable quantization resolutions to generate digital outputs representing intensities of light received by the image sensor.

In one example, an analog-to-digital converter (ADC) is provided. The ADC comprises a quantizer, the quantizer having a first quantization resolution for a first quantization operation subrange and a second quantization resolution for a second quantization operation subrange. At least one of the first quantization resolution or the first quantization operation subrange is programmable. At least one of the second quantization resolution or the second quantization operation subrange is programmable. The quantizer is configured to: receive an input voltage; based on whether the input voltage belongs to the first quantization operation subrange or to the second quantization operation subrange, quantize the input voltage at the first quantization resolution or at the second quantization resolution to generate a digital output.

In some aspects, the first quantization resolution and the first quantization operation subrange are separately programmable. The second quantization resolution and the second quantization operation subrange are separately programmable.

In some aspects, the quantizer is further configured to receive programming information, wherein the programming information defines the first quantization operation subrange, the second quantization operation subrange, the first quantization resolution for the first quantization operation subrange, and the second quantization resolution for the second quantization operation subrange. The quantizer is programmed based on the programming information.

In some aspects, the quantizer comprises: a threshold generator configured to provide a threshold voltage ramp, where in the threshold voltage ramp starts at a reference time; a quantization comparator configured to compare the input voltage with threshold voltage ramp; and a digital time measurement circuit configured to generate, based on an input clock signal, a measurement of a time duration elapsed between the reference time and a crossover time when a voltage of the threshold voltage ramp matches the input voltage. The digital output is generated based on the measurement of the time duration. The first quantization operation subrange and the second quantization operation subrange are defined based on at least one of: time durations elapsed from the reference time, or voltages of the threshold voltage ramp. The first quantization resolution and the second quantization resolution are defined based on at least one of: a frequency of the input clock signal within the time durations, or a ramp rate of the threshold voltage ramp between the voltages.

In some aspects, the digital time measurement circuit includes a first counter configured to generate a first count value based on counting a number of clock cycles of the input clock signal, the first count value corresponding to the measurement of the time duration between the reference time and the crossover time. The quantizer is configured to receive, based on the programming information, a first control signal at a first time and a second control signal at a second time. The first control signal comprises a first clock signal of a first clock frequency provided to the first counter as the input clock signal for the first quantization operation subrange, the first clock frequency being set based on the first quantization resolution. The second control signal comprises a second clock signal of a second clock frequency provided to the first counter as the input clock signal for the second quantization operation subrange, the second clock frequency being set based on the second quantization resolution. The first time defines the first quantization operation subrange. The second time defines the second quantization operation subrange. The crossover time is within one of the first time or the second time.

In some aspects, the ADC further comprises a reference counter configured to generate a reference count value based on counting a number of clock cycles of a reference input clock. The quantizer is configured to receive the first clock signal between when the reference count value equals a first threshold count corresponding to start of the first time. The quantizer is configured to receive the second clock signal when the reference count value equals a second threshold count corresponding to start of the second time. The first threshold count and the second threshold count are included in the programming information.

In some aspects, the ADC further comprises a first comparator, a second comparator, a first clock generator, a second clock generator, and a selection circuit. The first clock generator is configured to generate the first clock signal. The second clock generator is configured to generate the second clock signal. The first comparator is configured to generate a first comparison result based on comparing the reference count value against the first threshold count. The second comparator is configured to generate a second comparison result based on comparing the reference count value against the second threshold count. The selection circuit is configured to select, based on the first comparison result and the second comparison result, one of the first clock signal from the first clock generator or the second clock signal from the second clock generator for outputting to the digital time measurement circuit of the quantizer.

In some aspects, at least one of: the reference counter, the first comparator, the second comparator, the first clock generator, the second clock generator, or the selection circuit is external to the quantizer.

In some aspects, the quantizer is configured to receive, based on the programming information, a first control signal at a first time and a second control signal at a second time. The first control signal comprises a first voltage ramp between a first voltage and a second voltage provided to the threshold generator to be output as the threshold voltage ramp for the first quantization operation subrange, the first voltage ramp having a first ramp rate, the first ramp rate being set based on the first quantization resolution. The second control signal comprises a second voltage ramp between a third voltage and a fourth voltage provided to the threshold generator to be output as the threshold voltage ramp for the second quantization operation subrange, the second voltage ramp having a second ramp rate, the second ramp rate being set based on the second quantization resolution. The first voltage and the second voltage define the first quantization operation subrange. The third voltage and the fourth voltage define the second quantization operation subrange. The input voltage is between the first voltage and the second voltage or between the third voltage and the fourth voltage.

In some aspects, the ADC further comprises a reference ramp generator configured to generate a reference ramp. The quantizer is configured to receive a voltage based on the first voltage ramp when a voltage of the reference ramp equals a first threshold voltage. The quantizer is configured to receive a voltage based on the second voltage ramp when a voltage of the reference ramp equals a second threshold voltage. The first threshold voltage and the second threshold voltage are included in the programming information.

In some aspects, the ADC further comprises a first comparator, a second comparator, a first ramp generator, a second ramp generator, and a selection circuit. The first ramp generator is configured to generate the first voltage ramp. The second ramp generator is configured to generate the second voltage ramp. The first comparator is configured to generate a first comparison result based on comparing a voltage of the reference ramp against the first threshold voltage. The second comparator is configured to generate a second comparison result based on comparing a voltage of the reference ramp against the second threshold voltage. The selection circuit is configured to select, based on the first comparison result and the second comparison result, one of the first voltage ramp from the first ramp generator or the second voltage ramp from the second ramp generator for outputting to the threshold generator of the quantizer.

In some aspects, the reference ramp generator includes a reference current source and a first capacitor, the reference current source being configured to deposit charges at the first capacitor to generate the reference ramp. The first ramp generator includes a first current source. The second ramp generator includes a second current source. The selection circuit is coupled with a second capacitor and configured to select, based on the first comparison result and the second comparison result, one of the first current source or the second current source to deposit charges at the second capacitor to output the first voltage ramp or the second voltage ramp to the threshold generator of the quantizer.

In some aspects, at least one of: the reference ramp generator, the first comparator, the second comparator, the first ramp generator, the second ramp generator, or the selection circuit is external to the quantizer.

In some aspects, the ADC further comprises a configurable current source and a resistor. The configurable current source is configured to supply a configurable current to the resistor to develop a voltage. The current supplied by the configurable current source is configured based on a sequence of patterns to control the configurable current source to generate the threshold voltage ramp at a first voltage ramp rate within a first time and at a second voltage ramp rate within a second time. The sequence of patterns is included in the programming information.

In some aspects, the programming information defines a first voltage ramp rate for the threshold voltage ramp and a first clock frequency for the input clock signal to set the first quantization resolution. The programmable information further defines a second voltage ramp rate for the threshold voltage ramp and a second clock frequency for the input clock signal to set the second quantization resolution.

In one example, a pixel cell array is provided. The pixel cell array comprises a first pixel cell coupled with a first analog-to-digital converter (ADC) having programmable quantization resolution, the first ADC being configured to generate a first digital output by quantizing a measurement of an intensity of light received by the first pixel cell at a first programmed quantization resolution. The pixel cell array further comprises a second pixel cell coupled with a second ADC having programmable quantization resolution, the second ADC being configured to generate a second digital output by quantizing a measurement of an intensity of light received by the second pixel cell at a second programmed quantization resolution.

In some aspects, the first programmed quantization resolution and the second programmed quantization resolution are set at a first value at a first time and a second value different from the first value at a second time.

In some aspects, the first programmed quantization resolution and the second programmed quantization resolution are set for quantizing a range of measurements corresponding to a common intensity range of light. The first programmed quantization resolution has a different value from the second programmed quantization resolution. The first programmed quantization resolution and the second programmed quantization resolution are set based on, respective, a first location of the first pixel cell and a second location of the second pixel cell within the pixel cell array.

In some aspects, each of the first ADC and the second ADC comprises, respectively, a first counter and a second counter. The first counter and the second counter are configured to convert a measurement of an intensity of light received at the first pixel cell and at the second pixel cell into a measurement of time to generate, respectively, the first digital output and the second digital output. The first programmed quantization resolution is set based on setting an input clock to the first counter at a first clock frequency. The second programmed quantization resolution is set based on setting an input clock to the second counter at a second clock frequency.

In some aspects, each of the first ADC and the second ADC comprises, respectively, a first comparator and a second comparator. The first comparator is configured to compare a first voltage representing an intensity of light received at the first pixel cell against a first voltage ramp having a first ramp rate. The second comparator is configured to compare a second voltage representing an intensity of light received at the second pixel cell against a second voltage ramp having a second ramp rate. The first programmed quantization resolution is set based on setting the first ramp rate. The second programmed quantization resolution is set based on setting the second ramp rate.

BRIEF DESCRIPTION OF THE DRAWINGS

Illustrative embodiments are described with reference to the following figures.

Figure 1A:
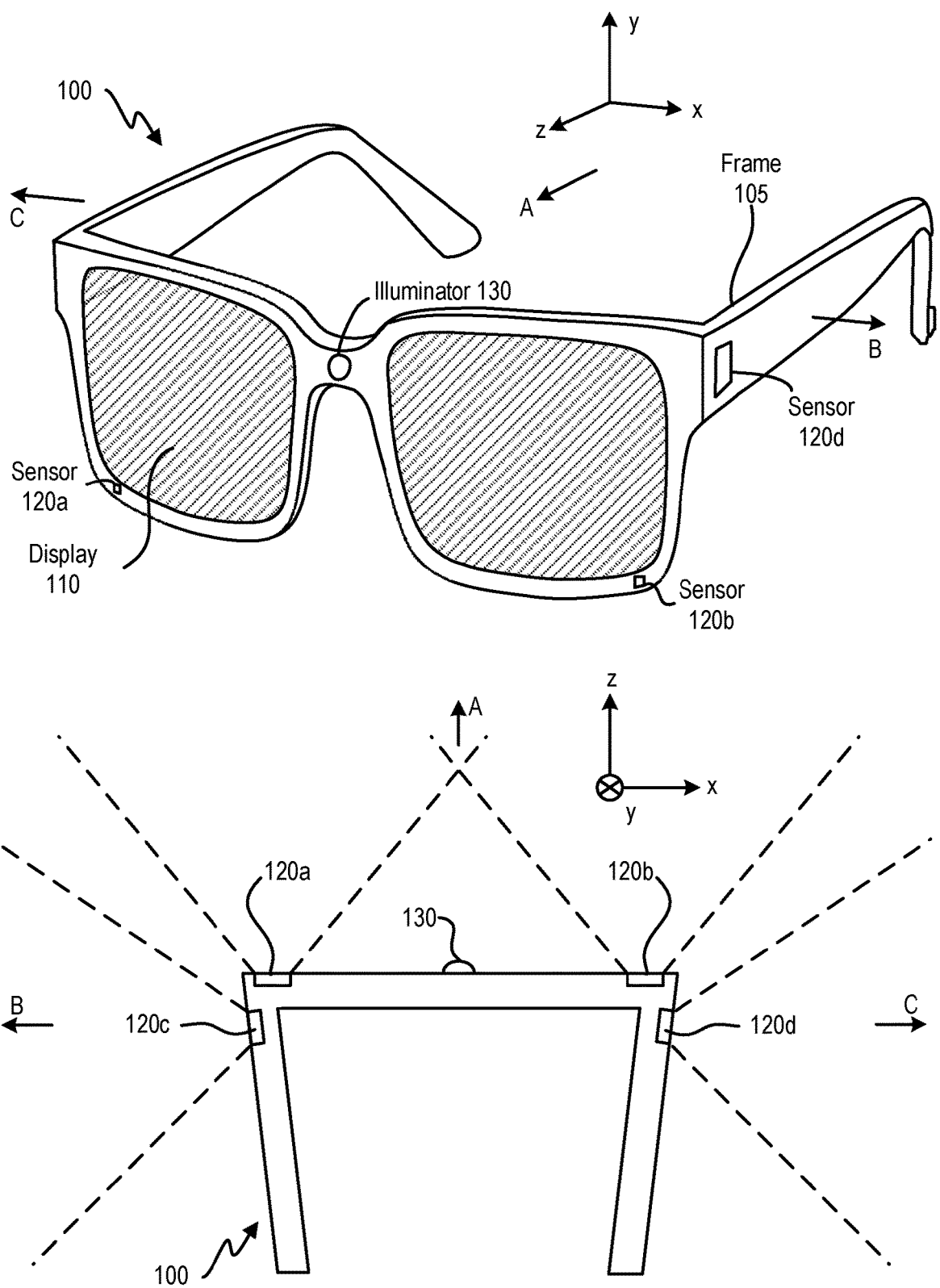
FIGS. 1A and 1B are diagrams of an embodiment of a near-eye display.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

ADC can be found in many applications, such as image processing. A typical image sensor includes a photodiode to sense incident light by converting photons into charges (e.g., electrons or holes). The image sensor further includes a floating node configured as a capacitor to collect the charges generated by the photodiode during an exposure period. The collected charges can develop a voltage at the capacitor. The voltage can be buffered and fed to an ADC, which can convert the voltage into a digital value representing the intensity of the incident light.

The digital value, which represents a quantity of charges stored at the floating node within a certain period, may correlate to the intensity of the incident light to a certain degree. The degree of correlation can be affected by different factors including, for example, measurement errors introduced by the ADC in determining the quantity of charges. One source of measurement error is quantization error. In a quantization process, a discrete set of quantization levels can be used represent a continuous value. In this example of ADC application, the set of quantization levels can be represented by a discrete and fixed set of charge quantity levels. The discrete set of quantity levels can be uniformly distributed across a range of input charge quantities set based on, for example, a range of light intensity to be quantized by the ADC. The discrete set of quantity levels can divide the range of input charge quantities into subranges, and each subrange can be associated with a digital code. The ADC can compare an input quantity of charges (e.g., charges stored at the floating drain node) against the quantity levels, and determine a subrange that includes the input quantity. The ADC can output a digital code representing the subrange. Quantization error can occur when there is a mismatch between a quantity of charges represented by the digital code (e.g., the middle of a subrange) and an input quantity of charges represented by the digital code. The quantization error can be reduced with smaller quantization step sizes (e.g., by reducing the subrange between two adjacent quantity levels).

In addition to quantization error, there are other factors that can further reduce the degree of correlation. For example, the ADC, as well as other interfacing circuits (e.g., source follower) can add noise charges due to device noises (e.g., read noise, shot noise, thermal noise, etc.) as well as noises through capacitive coupling. In addition, the stored charges can also be affected by dark current, which can be leakage currents generated at the p-n junctions due to crystallographic defects.

The noise charges and the ADC measurement errors can define a lower limit of the measureable light intensity of the image sensor. A ratio between an upper limit of measureable light intensity and the lower limit of measureable light intensity defines a dynamic range, which may set a range of operational light intensities for the image sensor. A high dynamic range is desirable for many applications of image sensors including, for example, where image sensors can be configured as input devices to control or influence the operation of a device, such as controlling or influencing the display content of a near-eye display in wearable virtual-reality (VR) systems and/or augmented-reality (AR) and/or mixed reality (MR) systems. For example, a wearable VR/AR/MR system may operate in environments with a very wide range of light intensities. For example, the wearable VR/AR/MR system may be able to operate in an indoor environment or in an outdoor environment, and/or at different times of the day, and the light intensity of the operation environment of the wearable VR/AR/MR system may vary substantially. Moreover, the wearable VR/AR/MR system may also include an eyeball tracking system, which may require projecting lights of very low intensity into the eyeballs of the user to prevent damaging the eyeballs. As a result, the image sensors of the wearable VR/AR/MR system may need to have a wide dynamic range to be able to operate properly (e.g., to generate an output that correlates with the intensity of incident light) across a very wide range of light intensities associated with different operating environments.

One way to improve dynamic range is by reducing the lower limit of the measureable light intensity, which can be achieved by, for example, reducing quantization error, which can be achieved by increasing the quantization resolution of the ADC. As described above, in a quantization process, an input quantity of charges can be compared against a discrete and fixed set of quantity levels, and the ADC can generate a digital output representing, for example, the closet quantity level to the input quantity of charges. To improve quantization resolution, the quantization step size can be reduced, which can be achieved by reducing the difference between adjacent discrete quantity levels. This can be provided by having a larger number of discrete set of quantity levels uniformly distributed across the range of input quantities.

But an increase in the number of discrete sets of quantity levels also increases a total number of bits of the digital value needed to represent the comparison result. An increased number of bits of digital representation may require a wider bus for transmission and a larger memory device for storage, both of which can lead to increase in power consumption and are undesirable. As an illustrative example, in a case where the input is compared against eight discrete set of quantity levels, three bits are needed to represent each of the eight quantity levels and to represent the output which identifies one of the eight quantity levels that is closest to the input quantity. In comparison, where the input is compared against sixteen discrete set of quantity levels, four bits will be needed to represent the sixteen quantity levels. The problem is further exacerbated when the range of input quantities increases to further extend the lower limit of the measureable light intensity. With an increased range of input, the number of discrete sets of quantity levels can be further increased, which in turn further increases the total number of bits of the digital value. As a result, the power needed to transport and store the digital value can be further increased.

One way to mitigate the increase in the total number of bits, while improving quantization resolution, is by performing a non-uniform quantization process, in which an input is compared against a set of fixed quantization levels that are not uniformly distributed across the input range. The input range can be sub-divided into a plurality of sub-ranges, with each sub-range having different quantization step sizes. For example, a larger number of quantization levels (with reduced quantization step sizes) can be allocated to a lower input sub-range, whereas a smaller number of quantization levels (with increased quantization step sizes) can be allocated to a higher input sub-range. With such arrangement, the quantization error for measuring low charge quantity (which can correspond to low light intensity) can be reduced at the expense of higher quantization error for a higher charge quantity (which can correspond to a higher light intensity).

Although such arrangements can improve the quantization error for measuring low charge quantity, having fixed quantization levels (uniformly or non-uniformly distributed) can introduces inflexibilities in the quantization operation, which in turn can degrade the overall performance of the image sensor. First, the image sensor may operate under different operation conditions at different times, and a fixed quantization scheme that improves the performance of the image sensor in one operation condition may actually degrade the performance of the image sensor in another operation condition. For example, the image sensor may operate in an outdoor environment with weak ambient light during night time, and in an outdoor environment with stronger ambient light during day time. While increasing the number of quantization steps for low light intensity measurement can improve the image sensor's performance in the environment with weak ambient light, the image sensor's performance in measuring higher intensity light may be degraded where the image sensor operates in the higher input sub-range that is allocated a smaller number of quantization levels, and larger quantization errors may result. Second, when a set of image sensors (e.g., a pixel cell array) is used to capture an image of a scene, different image sensors may receive light of different intensities. A fixed quantization scheme applied to each of the image sensor can lead to, for example, some regions of the image having large quantization errors and some regions of the image having low quantization errors. The non-uniformity in the quantization errors within the image can also degrade the fidelity of representation of the scene by the image.

This disclosure relates to an analog-to-digital converter (ADC) which can be used in image processing. In one example, the ADC may include a quantizer, and a programmable configuration module. The programmable configuration module may receive programming information which can define a plurality of quantization operation subranges of the quantizer and set a quantization resolution of each of the plurality of quantization operation subranges. Based on the programming information, the programmable configuration module may transmit, within a first time to the quantizer, a first control signal to set a first quantization resolution of a first quantization operation subrange of the plurality of quantization operation subranges. The programmable configuration module may also transmit, within a second time to the quantizer, a second control signal to set a second quantization resolution of a second quantization operation subrange of the plurality of quantization operation subranges. The quantizer may receive an input voltage and, based on whether a quantization operation of the input voltage is within the first quantization operation subrange or within the second quantization operation subrange, quantize the input voltage at the first quantization resolution set by the first control signal or at the second quantization resolution set by the second control signal.

The disclosed techniques allow the quantization resolutions for each quantization operation subranges to be programmable, which allows the ADC to adapt a quantization scheme to different operation conditions. Such flexibility can improve the overall performance of the ADC. For example, in a case where the ADC is part of a pixel cell to measure incident light intensity to generate an image, the quantization resolutions can be programmed based on an ambient light intensity of the operation environment of the pixel cell. Under an environment with low light intensity (e.g., an outdoor environment during night time), the ADC can be programmed to allocate a larger number of quantization levels (with reduced quantization step sizes) to a lower input intensity range and allocate a smaller number of quantization levels (with increased quantization step sizes) to a higher input intensity range. The programming can be based on the assumption that the pixel cell is unlikely to receive light of higher intensity. In contrast, under an environment with relatively high light intensity (e.g., an outdoor environment during daytime), the ADC can be programmed to allocate a smaller number of quantization levels (with increased quantization step sizes) to a lower input intensity range and allocate a larger number of quantization levels (with reduced quantization step sizes) to a higher input intensity range, based on the assumption that the pixel cell is unlikely to receive light of low intensity.

As another example, an ADC (or the ADC included in each pixel cell) can also be programmed to allocate maximum number of quantization levels for different input intensity range for different pixel cells of a pixel array. Such arrangements can be based on different pixel cells (or different regions of pixel cells) may receive light of different intensities. An ADC (or the ADC included in each pixel cell) can be programmed to minimize the quantization error for an intensity range of light most likely received by each pixel cell, and the intensity range having the minimum quantization error can be programmed differently for each pixel cell.

With these arrangements, the ADC can be optimized, either statically or dynamically, to reduce quantization error for an input range from which the ADC is most likely to receive an input. Such flexibility can extend the dynamic range of the ADC and improve the overall performance of the ADC.

Embodiments of the disclosure may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

FIG. 1A is a diagram of an embodiment of a near-eye display 100. Near-eye display 100 presents media to a user. Examples of media presented by near-eye display 100 include one or more images, video, and/or audio. In some embodiments, audio is presented via an external device (e.g., speakers and/or headphones) that receives audio information from the near-eye display 100, a console, or both, and presents audio data based on the audio information. Near-eye display 100 is generally configured to operate as a virtual reality (VR) display. In some embodiments, near-eye display 100 is modified to operate as an augmented reality (AR) display and/or a mixed reality (MR) display.

Near-eye display 100 includes a frame 105 and a display 110. Frame 105 is coupled to one or more optical elements. Display 110 is configured for the user to see content presented by near-eye display 100. In some embodiments, display 110 comprises a waveguide display assembly for directing light from one or more images with an eye of the user.

Near-eye display 100 further includes image sensors 120a, 120b, 120c, and 120d. Each of image sensors 120a, 120b, 120c, and 120d may include a pixel array configured to generate image data representing different fields of views along different directions. For example, sensors 120a and 120b may be configured to provide image data representing two fields of views towards a direction A along the Z axis, whereas sensor 120c may be configured to provide image data representing a field of view towards a direction B along the X axis, and sensor 120d may be configured to provide image data representing a field of view towards a direction C along the X axis.

In some embodiments, sensors 120a-120d can be configured as input devices to control or influence the display content of the near-eye display 100, to provide an interactive VR/AR/MR experience to a user who wears near-eye display 100. For example, sensors 120a-120d can generate physical image data of a physical environment in which the user is located. The physical image data can be provided to a location tracking system to track a location and/or a path of movement of the user in the physical environment. A system can then update the image data provided to display 110 based on, for example, the location and orientation of the user, to provide the interactive experience. In some embodiments, the location tracking system may operate a SLAM algorithm to track a set of objects in the physical environment and within a view of field of the user as the user moves within the physical environment. The location tracking system can construct and update a map of the physical environment based on the set of objects, and track the location of the user within the map. By providing image data corresponding to multiple fields of views, sensors 120a-120d can provide the location tracking system a more holistic view of the physical environment, which can lead to more objects to be included in the construction and updating of the map. With such arrangement, the accuracy and robustness of tracking a location of the user within the physical environment can be improved.

In some embodiments, near-eye display 100 may further include one or more active illuminator 130 to project light into the physical environment. The light projected can be associated with different frequency spectrums (e.g., visible light, infra-red light, ultra-violet light, etc.), and can serve various purposes. For example, illuminator 130 may project light in a dark environment (or in an environment with low intensity of infra-red light, ultra-violet light, etc.) to assist sensors 120a-120d in capturing images of different objects within the dark environment to, for example, enable location tracking of the user. Illuminator 130 may project certain markers onto the objects within the environment, to assist the location tracking system in identifying the objects for map construction/updating.

In some embodiments, illuminator 130 may also enable stereoscopic imaging. For example, one or more of sensors 120a or 120b can include both a first pixel array for visible light sensing and a second pixel array for infra-red (IR) light sensing. The first pixel array can be overlaid with a color filter (e.g., a Bayer filter), with each pixel of the first pixel array being configured to measure intensity of light associated with a particular color (e.g., one of red, green or blue colors). The second pixel array (for IR light sensing) can also be overlaid with a filter that allows only IR light through, with each pixel of the second pixel array being configured to measure intensity of IR lights. The pixel arrays can generate an RGB image and an IR image of an object, with each pixel of the IR image being mapped to each pixel of the RGB image. Illuminator 130 may project a set of IR markers on the object, the images of which can be captured by the IR pixel array. Based on a distribution of the IR markers of the object as shown in the image, the system can estimate a distance of different parts of the object from the IR pixel array, and generate a stereoscopic image of the object based on the distances. Based on the stereoscopic image of the object, the system can determine, for example, a relative position of the object with respect to the user, and can update the image data provided to display 100 based on the relative position information to provide the interactive experience.

As discussed above, near-eye display 100 may be operated in environments associated with a very wide range of light intensities. For example, near-eye display 100 may be operated in an indoor environment or in an outdoor environment, and/or at different times of the day. Near-eye display 100 may also operate with or without active illuminator 130 being turned on. As a result, image sensors 120a-120d may need to have a wide dynamic range to be able to operate properly (e.g., to generate an output that correlates with the intensity of incident light) across a very wide range of light intensities associated with different operating environments for near-eye display 100.

Figure 1B:
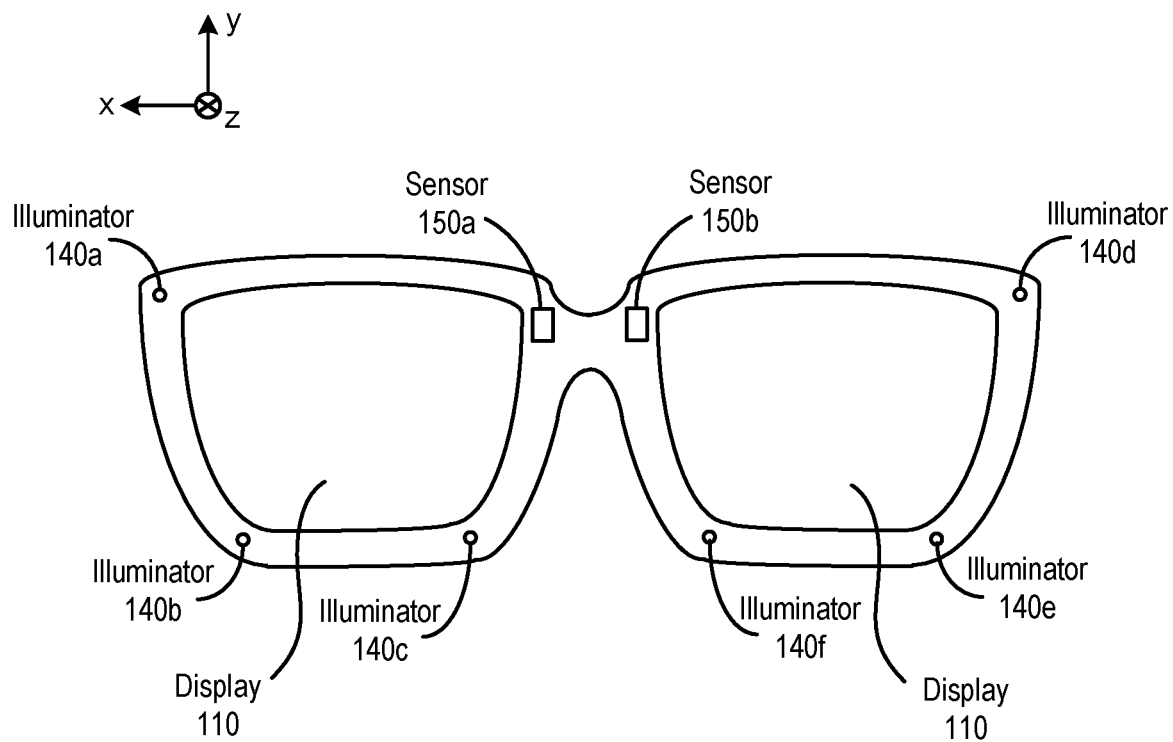

FIG. 1B is a diagram of another embodiment of near-eye display 100. FIG. 1B illustrates a side of near-eye display 100 that faces the eyeballl(s) 135 of the user who wears near-eye display 100. As shown in FIG. 1B, near-eye display 100 may further include a plurality of illuminators 140a, 140b, 140c, 140d, 140e, and 140f. Near-eye display 100 further includes a plurality of image sensors 150a and 150b. Illuminators 140a, 140b, and 140c may emit lights of certain frequency range (e.g., NIR) towards direction D (which is opposite to direction A of FIG. 1A). The emitted light may be associated with a certain pattern, and can be reflected by the left eyeball of the user. Sensor 150a may include a pixel array to receive the reflected light and generate an image of the reflected pattern. Similarly, illuminators 140d, 140e, and 140f may emit NIR lights carrying the pattern. The NIR lights can be reflected by the right eyeball of the user, and may be received by sensor 150b. Sensor 150b may also include a pixel array to generate an image of the reflected pattern. Based on the images of the reflected pattern from sensors 150a and 150b, the system can determine a gaze point of the user, and update the image data provided to display 100 based on the determined gaze point to provide an interactive experience to the user.

As discussed above, to avoid damaging the eyeballs of the user, illuminators 140a, 140b, 140c, 140d, 140e, and 140f are typically configured to output lights of very low intensities. In a case where image sensors 150a and 150b comprise the same sensor devices as image sensors 120a-120d of FIG. 1A, the image sensors 120a-120d may need to be able to generate an output that correlates with the intensity of incident light when the intensity of the incident light is very low, which may further increase the dynamic range requirement of the image sensors.

Moreover, the image sensors 120a-120d may need to be able to generate an output at a high speed to track the movements of the eyeballs. For example, a user's eyeball can perform a very rapid movement (e.g., a saccade movement) in which there can be a quick jump from one eyeball position to another. To track the rapid movement of the user's eyeball, image sensors 120a-120d need to generate images of the eyeball at high speed. For example, the rate at which the image sensors generate an image frame (the frame rate) needs to at least match the speed of movement of the eyeball. The high frame rate requires short total exposure time for all of the pixel cells involved in generating the image frame, as well as high speed for converting the sensor outputs into digital values for image generation. Moreover, as discussed above, the image sensors also need to be able to operate at an environment with low light intensity.

Figure 1B:
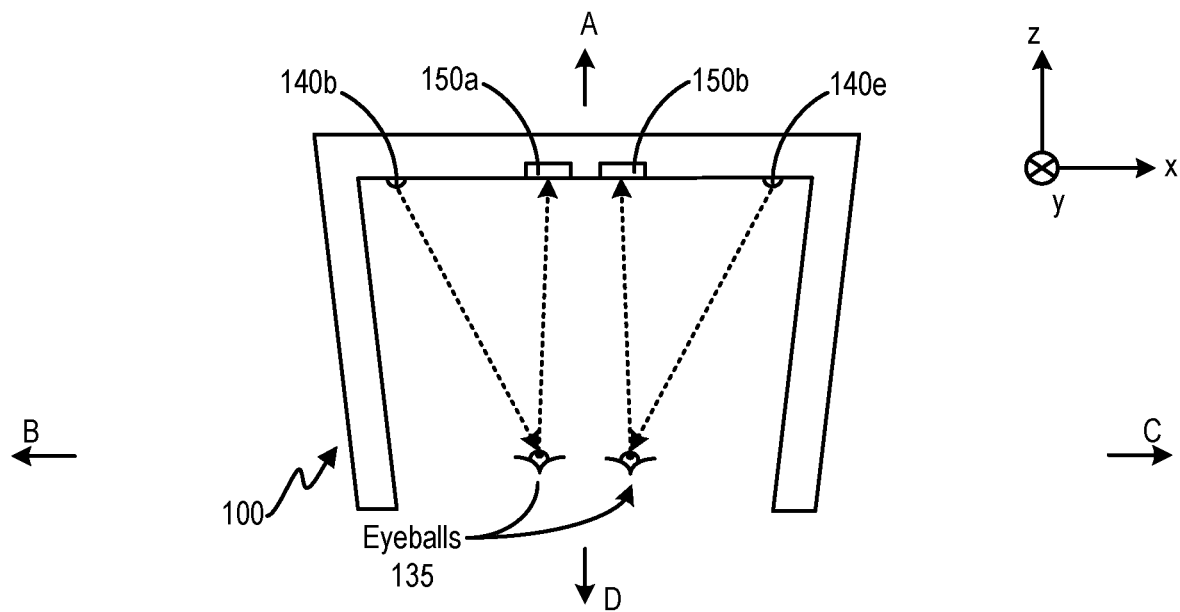
Figure 2:
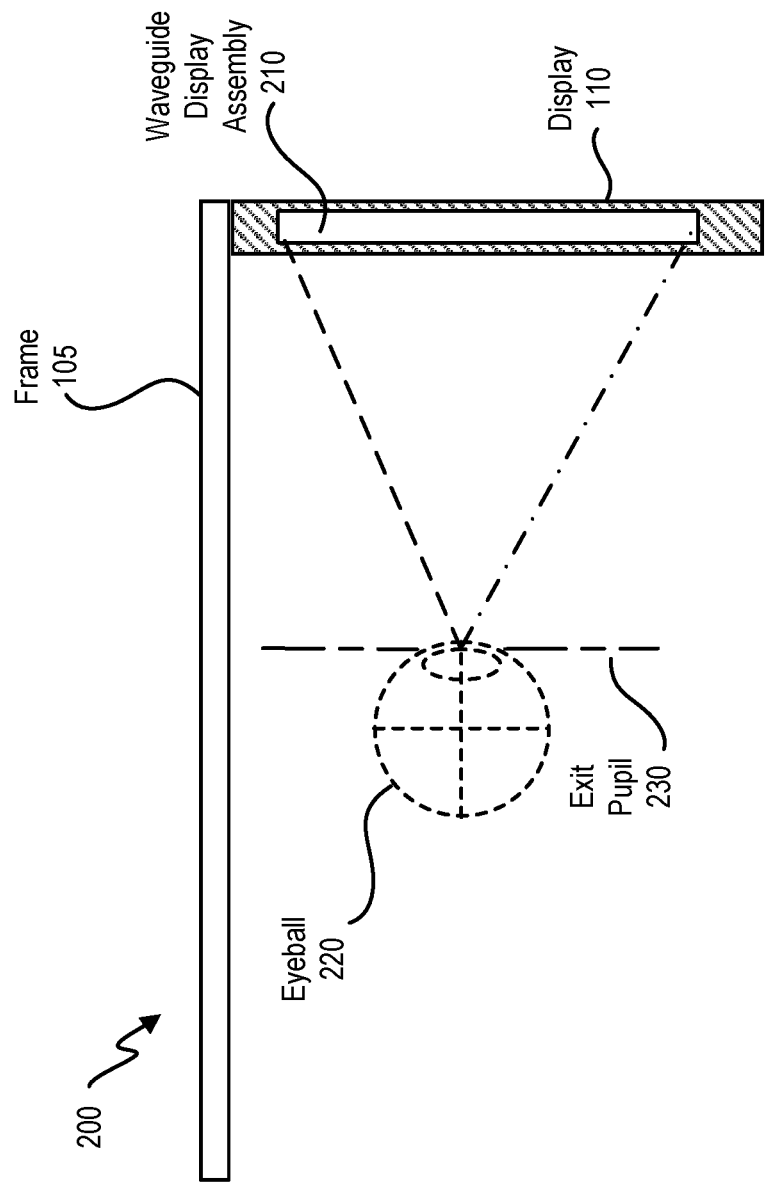
FIG. 2 is an embodiment of a cross section of the near-eye display.

FIG. 2 is an embodiment of a cross section 200 of near-eye display 100 illustrated in FIG. 1. Display 110 includes at least one waveguide display assembly 210. An exit pupil 230 is a location where a single eyeball 220 of the user is positioned in an eyebox region when the user wears the near-eye display 100. For purposes of illustration, FIG. 2 shows the cross section 200 associated eyeball 220 and a single waveguide display assembly 210, but a second waveguide display is used for a second eye of a user.

Waveguide display assembly 210 is configured to direct image light to an eyebox located at exit pupil 230 and to eyeball 220. Waveguide display assembly 210 may be composed of one or more materials (e.g., plastic, glass, etc.) with one or more refractive indices. In some embodiments, near-eye display 100 includes one or more optical elements between waveguide display assembly 210 and eyeball 220.

In some embodiments, waveguide display assembly 210 includes a stack of one or more waveguide displays including, but not restricted to, a stacked waveguide display, a varifocal waveguide display, etc. The stacked waveguide display is a polychromatic display (e.g., a red-green-blue (RGB) display) created by stacking waveguide displays whose respective monochromatic sources are of different colors. The stacked waveguide display is also a polychromatic display that can be projected on multiple planes (e.g., multi-planar colored display). In some configurations, the stacked waveguide display is a monochromatic display that can be projected on multiple planes (e.g., multi-planar monochromatic display). The varifocal waveguide display is a display that can adjust a focal position of image light emitted from the waveguide display. In alternate embodiments, waveguide display assembly 210 may include the stacked waveguide display and the varifocal waveguide display.

Figure 3:
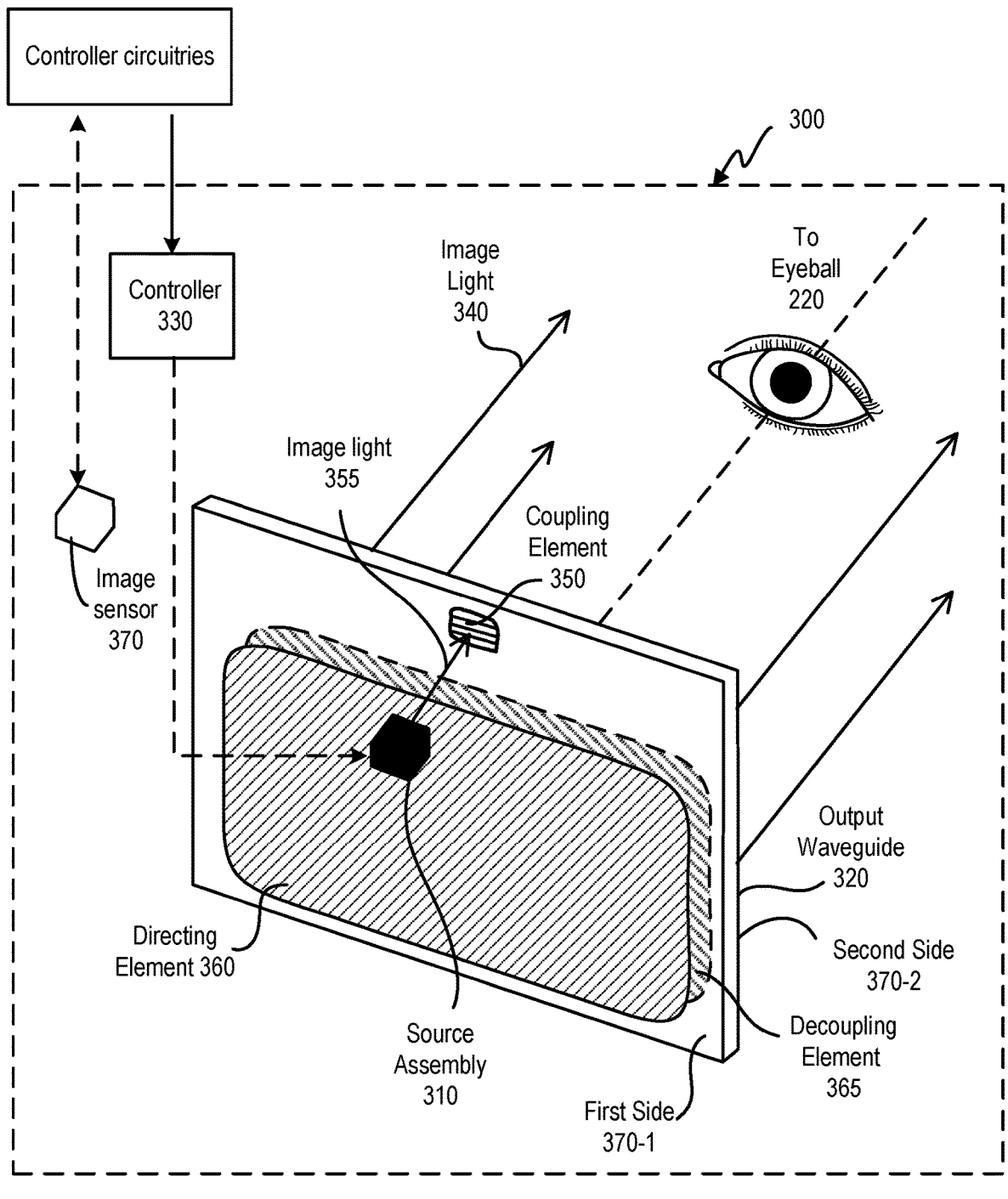
FIG. 3 illustrates an isometric view of an embodiment of a waveguide display with a single source assembly.

FIG. 3 illustrates an isometric view of an embodiment of a waveguide display 300. In some embodiments, waveguide display 300 is a component (e.g., waveguide display assembly 210) of near-eye display 100. In some embodiments, waveguide display 300 is part of some other near-eye display or other system that directs image light to a particular location.

Waveguide display 300 includes a source assembly 310, an output waveguide 320, and a controller 330. For purposes of illustration, FIG. 3 shows the waveguide display 300 associated with a single eyeball 220, but in some embodiments, another waveguide displays separate, or partially separate, from the waveguide display 300 provides image light to another eye of the user.

Source assembly 310 generates image light 355. Source assembly 310 generates and outputs image light 355 to a coupling element 350 located on a first side 370-1 of output waveguide 320. Output waveguide 320 is an optical waveguide that outputs expanded image light 340 to an eyeball 220 of a user. Output waveguide 320 receives image light 355 at one or more coupling elements 350 located on the first side 370-1 and guides received input image light 355 to a directing element 360. In some embodiments, coupling element 350 couples the image light 355 from source assembly 310 into output waveguide 320. Coupling element 350 may be, e.g., a diffraction grating, a holographic grating, one or more cascaded reflectors, one or more prismatic surface elements, and/or an array of holographic reflectors.

Directing element 360 redirects the received input image light 355 to decoupling element 365 such that the received input image light 355 is decoupled out of output waveguide 320 via decoupling element 365. Directing element 360 is part of, or affixed to, first side 370-1 of output waveguide 320. Decoupling element 365 is part of, or affixed to, second side 370-2 of output waveguide 320, such that directing element 360 is opposed to the decoupling element 365. Directing element 360 and/or decoupling element 365 may be, e.g., a diffraction grating, a holographic grating, one or more cascaded reflectors, one or more prismatic surface elements, and/or an array of holographic reflectors.

Second side 370-2 represents a plane along an x-dimension and a y-dimension. Output waveguide 320 may be composed of one or more materials that facilitate total internal reflection of image light 355. Output waveguide 320 may be composed of, e.g., silicon, plastic, glass, and/or polymers. Output waveguide 320 has a relatively small form factor. For example, output waveguide 320 may be approximately 50 mm wide along x-dimension, 30 mm long along y-dimension and 0.5-1 mm thick along a z-dimension.

Controller 330 controls scanning operations of source assembly 310. The controller 330 determines scanning instructions for the source assembly 310. In some embodiments, the output waveguide 320 outputs expanded image light 340 to the user's eyeball 220 with a large field of view (FOV). For example, the expanded image light 340 is provided to the user's eyeball 220 with a diagonal FOV (in x and y) of 60 degrees and/or greater and/or 150 degrees and/or less. The output waveguide 320 is configured to provide an eyebox with a length of 20 mm or greater and/or equal to or less than 50 mm; and/or a width of 10 mm or greater and/or equal to or less than 50 mm.

Moreover, controller 330 also controls image light 355 generated by source assembly 310, based on image data provided by image sensor 370. Image sensor 370 may be located on first side 370-1 and may include, for example, image sensors 120a-120d of FIG. 1A to generate image data of a physical environment in front of the user (e.g., for location determination). Image sensor 370 may also be located on second side 370-2 and may include image sensors 150a and 150b of FIG. 1B to generate image data of eyeball 220 (e.g., for gaze point determination) of the user. Image sensor 370 may interface with a remote console that is not located within waveguide display 300. Image sensor 370 may provide image data to the remote console, which may determine, for example, a location of the user, a gaze point of the user, etc., and determine the content of the images to be displayed to the user. The remote console can transmit instructions to controller 330 related to the determined content. Based on the instructions, controller 330 can control the generation and outputting of image light 355 by source assembly 310.

Figure 4:
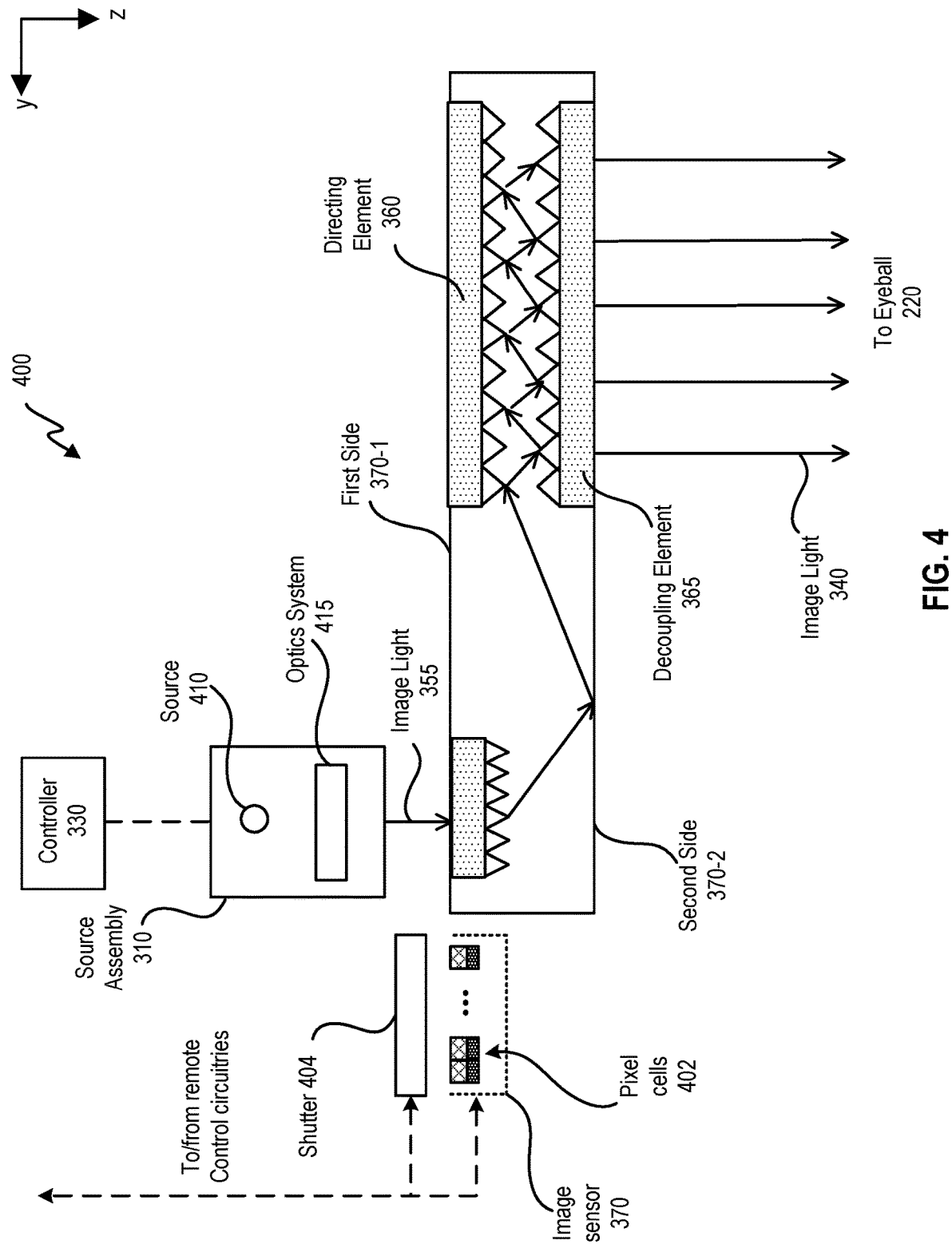
FIG. 4 illustrates a cross section of an embodiment of the waveguide display.

FIG. 4 illustrates an embodiment of a cross section 400 of the waveguide display 300. The cross section 400 includes source assembly 310, output waveguide 320, and image sensor 370. In the example of FIG. 4, image sensor 370 may include a set of pixel cells 402 located on first side 370-1 to generate an image of the physical environment in front of the user. In some embodiments, there can be a mechanical shutter 404 interposed between the set of pixel cells 402 and the physical environment to control the exposure of the set of pixel cells 402. In some embodiments, the mechanical shutter 404 can be replaced by an electronic shutter gate, as to be discussed below. Each of pixel cells 402 may correspond to one pixel of the image. Although not shown in FIG. 4, it is understood that each of pixel cells 402 may also be overlaid with a filter to control the frequency range of the light to be sensed by the pixel cells.

After receiving instructions from the remote console, mechanical shutter 404 can open and expose the set of pixel cells 402 in an exposure period. During the exposure period, image sensor 370 can obtain samples of lights incident on the set of pixel cells 402, and generates image data based on an intensity distribution of the incident light samples detected by the set of pixel cells 402. Image sensor 370 can then provide the image data to the remote console, which determines the display content, and provide the display content information to controller 330. Controller 330 can then determine image light 355 based on the display content information.

Source assembly 310 generates image light 355 in accordance with instructions from the controller 330. Source assembly 310 includes a source 410 and an optics system 415. Source 410 is a light source that generates coherent or partially coherent light. Source 410 may be, e.g., a laser diode, a vertical cavity surface emitting laser, and/or a light emitting diode.

Optics system 415 includes one or more optical components that condition the light from source 410. Conditioning light from source 410 may include, e.g., expanding, collimating, and/or adjusting orientation in accordance with instructions from controller 330. The one or more optical components may include one or more lenses, liquid lenses, mirrors, apertures, and/or gratings. In some embodiments, optics system 415 includes a liquid lens with a plurality of electrodes that allows scanning of a beam of light with a threshold value of scanning angle to shift the beam of light to a region outside the liquid lens. Light emitted from the optics system 415 (and also source assembly 310) is referred to as image light 355.

Output waveguide 320 receives image light 355. Coupling element 350 couples image light 355 from source assembly 310 into output waveguide 320. In embodiments where coupling element 350 is diffraction grating, a pitch of the diffraction grating is chosen such that total internal reflection occurs in output waveguide 320, and image light 355 propagates internally in output waveguide 320 (e.g., by total internal reflection), toward decoupling element 365.

Directing element 360 redirects image light 355 toward decoupling element 365 for decoupling from output waveguide 320. In embodiments where directing element 360 is a diffraction grating, the pitch of the diffraction grating is chosen to cause incident image light 355 to exit output waveguide 320 at angle(s) of inclination relative to a surface of decoupling element 365.

In some embodiments, directing element 360 and/or decoupling element 365 are structurally similar. Expanded image light 340 exiting output waveguide 320 is expanded along one or more dimensions (e.g., may be elongated along x-dimension). In some embodiments, waveguide display 300 includes a plurality of source assemblies 310 and a plurality of output waveguides 320. Each of source assemblies 310 emits a monochromatic image light of a specific band of wavelength corresponding to a primary color (e.g., red, green, or blue). Each of output waveguides 320 may be stacked together with a distance of separation to output an expanded image light 340 that is multi-colored.

Figure 5:
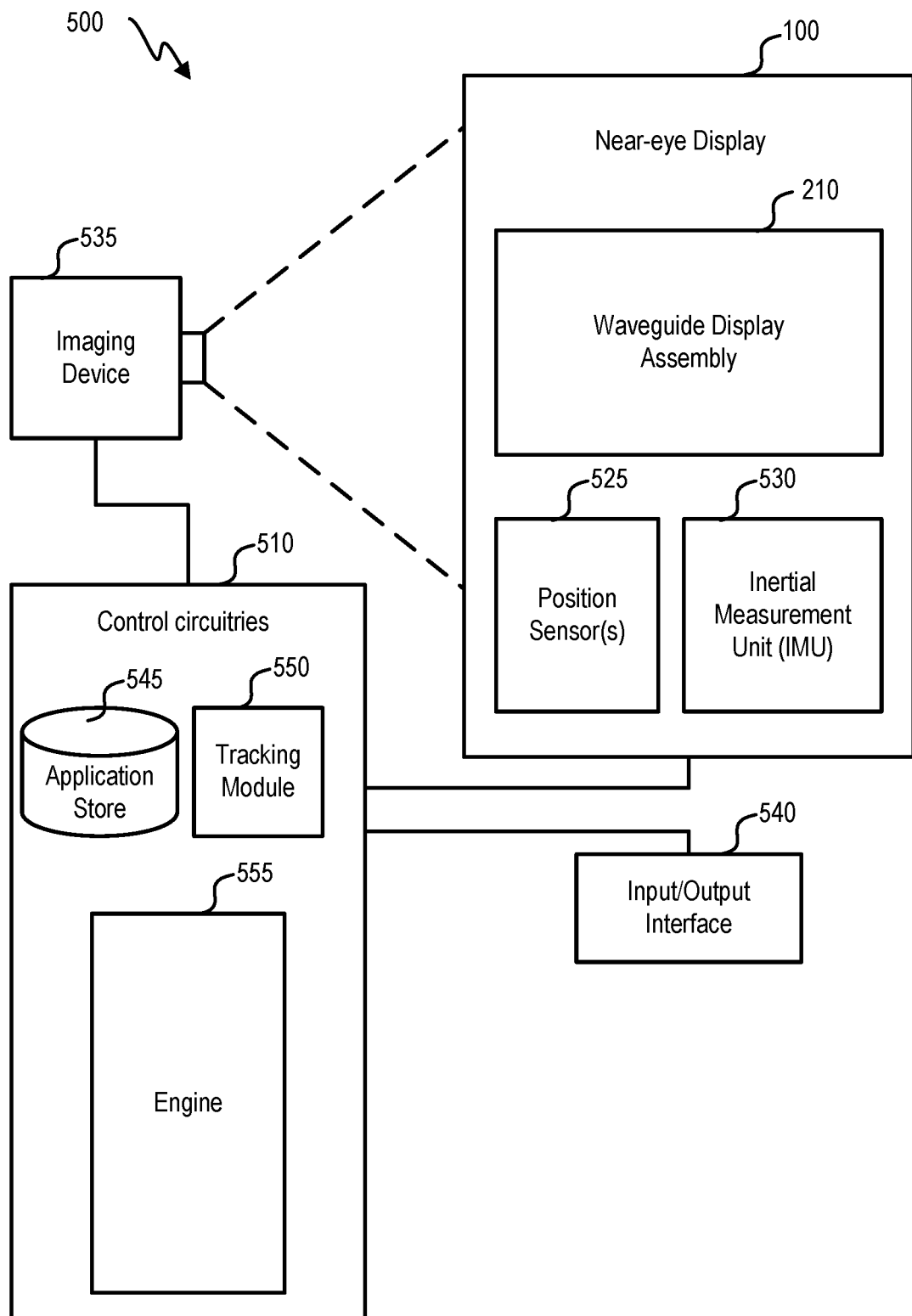
FIG. 5 is a block diagram of an embodiment of a system including the near-eye display.

FIG. 5 is a block diagram of an embodiment of a system 500 including the near-eye display 100. The system 500 comprises near-eye display 100, an imaging device 535, an input/output interface 540, and image sensors 120a-120d and 150a-150b that are each coupled to control circuitries 510. System 500 can be configured as a head-mounted device, a wearable device, etc.

Near-eye display 100 is a display that presents media to a user. Examples of media presented by the near-eye display 100 include one or more images, video, and/or audio. In some embodiments, audio is presented via an external device (e.g., speakers and/or headphones) that receives audio information from near-eye display 100 and/or control circuitries 510 and presents audio data based on the audio information to a user. In some embodiments, near-eye display 100 may also act as an AR eyewear glass. In some embodiments, near-eye display 100 augments views of a physical, real-world environment, with computer-generated elements (e.g., images, video, sound, etc.).

Near-eye display 100 includes waveguide display assembly 210, one or more position sensors 525, and/or an inertial measurement unit (IMU) 530. Waveguide display assembly 210 includes source assembly 310, output waveguide 320, and controller 330.

IMU 530 is an electronic device that generates fast calibration data indicating an estimated position of near-eye display 100 relative to an initial position of near-eye display 100 based on measurement signals received from one or more of position sensors 525.

Imaging device 535 may generate image data for various applications. For example, imaging device 535 may generate image data to provide slow calibration data in accordance with calibration parameters received from control circuitries 510. Imaging device 535 may include, for example, image sensors 120a-120d of FIG. 1A for generating image data of a physical environment in which the user is located, for performing location tracking of the user. Imaging device 535 may further include, for example, image sensors 150a-150b of FIG. 1B for generating image data for determining a gaze point of the user, to identify an object of interest to the user.

The input/output interface 540 is a device that allows a user to send action requests to the control circuitries 510. An action request is a request to perform a particular action. For example, an action request may be to start or end an application or to perform a particular action within the application.

Control circuitries 510 provides media to near-eye display 100 for presentation to the user in accordance with information received from one or more of: imaging device 535, near-eye display 100, and input/output interface 540. In some examples, control circuitries 510 can be housed within system 500 configured as a head-mounted device. In some examples, control circuitries 510 can be a standalone console device communicatively coupled with other components of system 500. In the example shown in FIG. 5, control circuitries 510 include an application store 545, a tracking module 550, and an engine 555.

The application store 545 stores one or more applications for execution by the control circuitries 510. An application is a group of instructions, that, when executed by a processor, generates content for presentation to the user. Examples of applications include: gaming applications, conferencing applications, video playback application, or other suitable applications.

Tracking module 550 calibrates system 500 using one or more calibration parameters and may adjust one or more calibration parameters to reduce error in determination of the position of the near-eye display 100.

Tracking module 550 tracks movements of near-eye display 100 using slow calibration information from the imaging device 535. Tracking module 550 also determines positions of a reference point of near-eye display 100 using position information from the fast calibration information.

Engine 555 executes applications within system 500 and receives position information, acceleration information, velocity information, and/or predicted future positions of near-eye display 100 from tracking module 550. In some embodiments, information received by engine 555 may be used for producing a signal (e.g., display instructions) to waveguide display assembly 210 that determines a type of content presented to the user. For example, to provide an interactive experience, engine 555 may determine the content to be presented to the user based on a location of the user (e.g., provided by tracking module 550), a gaze point of the user (e.g., based on image data provided by imaging device 535), a distance between an object and user (e.g., based on image data provided by imaging device 535).

Figure 6:
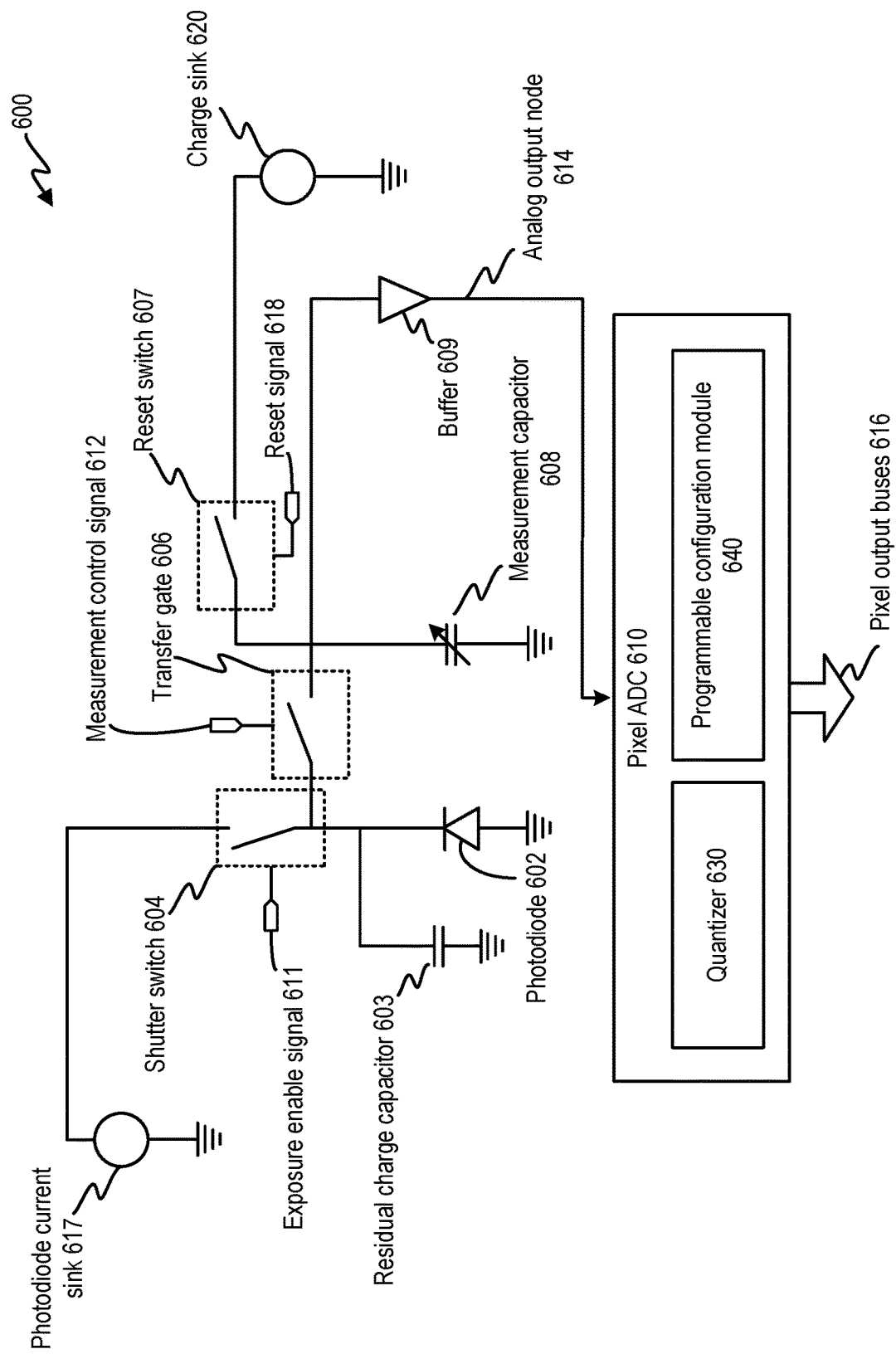
FIG. 6 illustrates block diagrams of embodiments of a pixel cell.

FIG. 6 illustrates an example of a pixel cell 600. Pixel cell 600 may be part of a pixel array and can generate digital intensity data corresponding to a pixel of an image. For example, pixel cell 600 may be part of pixel cells 402 of FIG. 4. As shown in FIG. 6, pixel cell 600 may include a photodiode 602, a residual charge capacitor 603, a shutter switch 604, a transfer gate 606, a reset switch 607, a measurement capacitor 608, a buffer 609, and a pixel ADC 610.

In some embodiments, photodiode 602 may include a P-N diode or a P-I-N diode. Each of shutter switch 604, transfer gate 606, and reset switch 607 can include a transistor. The transistor may include, for example, a metal-oxide-semiconductor field-effect transistor (MOSFET), a bipolar junction transistor (BJT), etc. Shutter switch 604 can act as an electronic shutter gate (in lieu of, or in combination with, mechanical shutter 404 of FIG. 4) to control an exposure period of pixel cell 600. During the exposure period, shutter switch 604 can be disabled (turned off) by exposure enable signal 611, which allows charges generated by photodiode 602 to move to residual charge capacitor 603 and/or measurement capacitor 608. At the end of the exposure period, shutter switch 604 can be enabled to steer the charges generated by photodiode 602 into photodiode current sink 617. Moreover, reset switch 607 can also be disabled (turned off) by reset signal 618, which allows measurement capacitor 608 to accumulate the charges and develop a voltage that reflects a quantity of the accumulated charges. After a mode of measurement completes, reset switch 607 can be enabled to empty the charges stored at measurement capacitor 608 to charge sink 620, to make measurement capacitor 608 available for the next measurement.

Residual charge capacitor 603 can be a device capacitor of photodiode 602 and can store charges generated by photodiode 602. Residual charge capacitor 603 can include, for example, a junction capacitor at the P-N diode junction interface, or other device capacitor(s) connected to photodiode 602. Due to the proximity of residual charge capacitor 603 to photodiode 602, charges generated by photodiode 602 may be accumulated at charge capacitor 603. Measurement capacitor 608 can be a device capacitor at a floating terminal of transfer gate 606, a metal capacitor, a MOS capacitor, or any combination thereof. Measurement capacitor 608 can be used to store a quantity of charges. The charges stored at measurement capacitor 608 can be either overflow charges (from photodiode 602) that are not to be accumulated at residual charge capacitor 603, or residual charges that are emptied from residual charge capacitor 603. The charges stored at measurement capacitor 608 can develop an analog voltage based on a quantity of the stored charges and the capacitance of measurement capacitor 608. The analog voltage can represent the quantity of the stored charges as well as the incident light intensity.

Pixel ADC 610 can measure the analog voltage developed at measurement capacitor 608, and provide a digital output representing the incident light intensity. Pixel ADC 610 includes a quantizer 630 and a programmable configuration module 640. Quantizer 630 can quantize the analog voltage according to a quantization scheme, whereas programmable configuration module 640 can receive programming information and change the quantization scheme employed by quantizer 630. Although FIG. 6 shows that quantization 630 and programmable configuration module 640 are separate entities, it is understood that internal components of programmable configuration module 640, to be described in details below, can be part of quantizer 630.

Figure 7A:
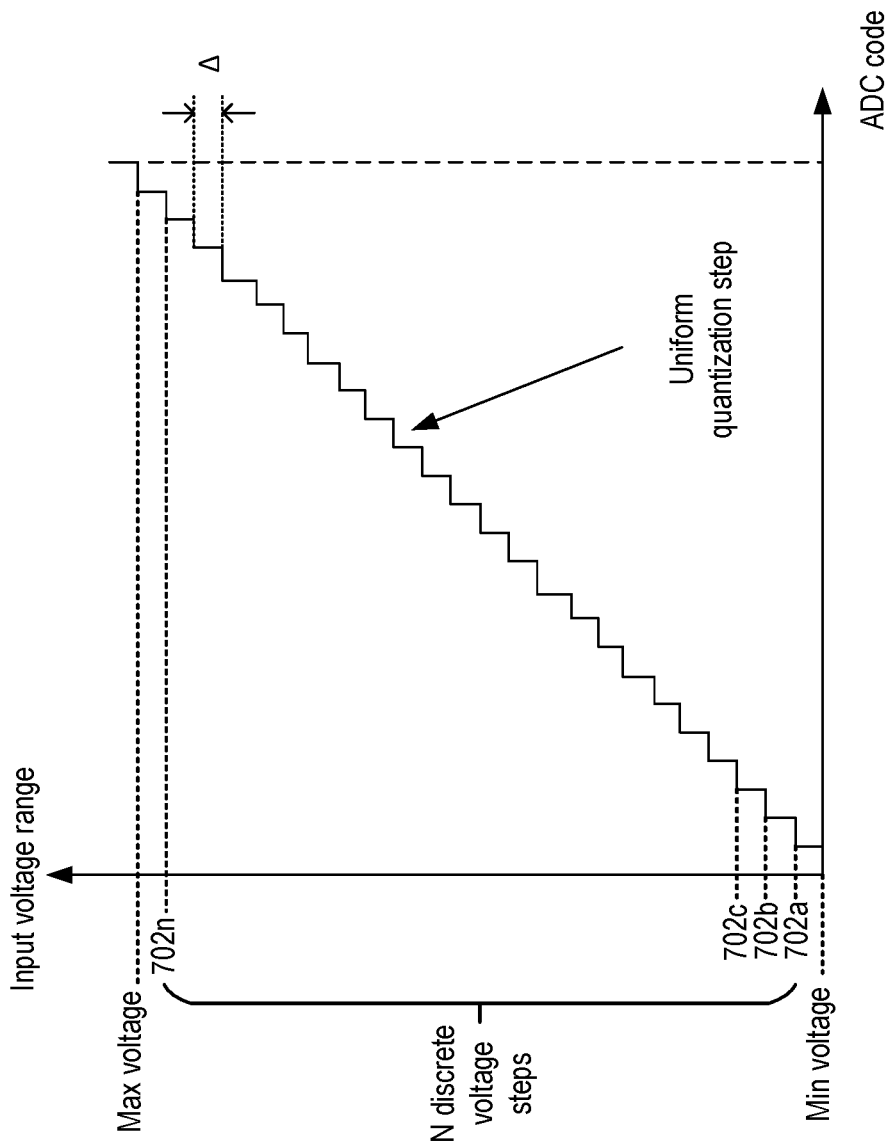
FIGS. 7A, 7B, 7C, 7D, 7E, and 7F illustrate examples of quantization operations for determining light intensities by the pixel cell of FIG. 6.

FIG. 7A illustrates an example of a quantization scheme that can be employed by quantizer 630 to quantize the analog voltage at measurement capacitor 608. As shown in FIG. 7A, an uniform quantization scheme can be used, which includes a set of N discrete voltage steps (denoted by a step size Δ in FIG. 7A) formed by discrete voltage levels including, for example, voltage level 702a, voltage level 702b, voltage level 702c, voltage level 702n, etc., uniformly distributed across an input voltage range to be quantized by quantizer 630. Each discrete voltage level can represent a charge quantity level (and a light intensity), whereas the input voltage range can represent one quantization operation range, which also represents a range of light intensity to be measured by quantizer 630. Each voltage level represents a quantization level in FIG. 7A. A digital code can be assigned for each voltage step. Pixel ADC 610 can determine which voltage step includes the input voltage, and output the digital code corresponding to the voltage step. The quantization error in the quantization scheme of FIG. 7A can be defined based on step size Δ. The number of bits of the digital code can be determined by the number of discrete voltage steps (N). For example, assuming the digital code is binary coded, the total number of bits can be given by $\log_2(N)$. To reduce quantization error, step size Δ can be reduced. With an uniform quantization scheme, a larger number of discrete voltage levels (N) will be needed to cover the same input voltage range. The total number of bits $\log_2(N)$ also increases as a result.

Figure 7B:
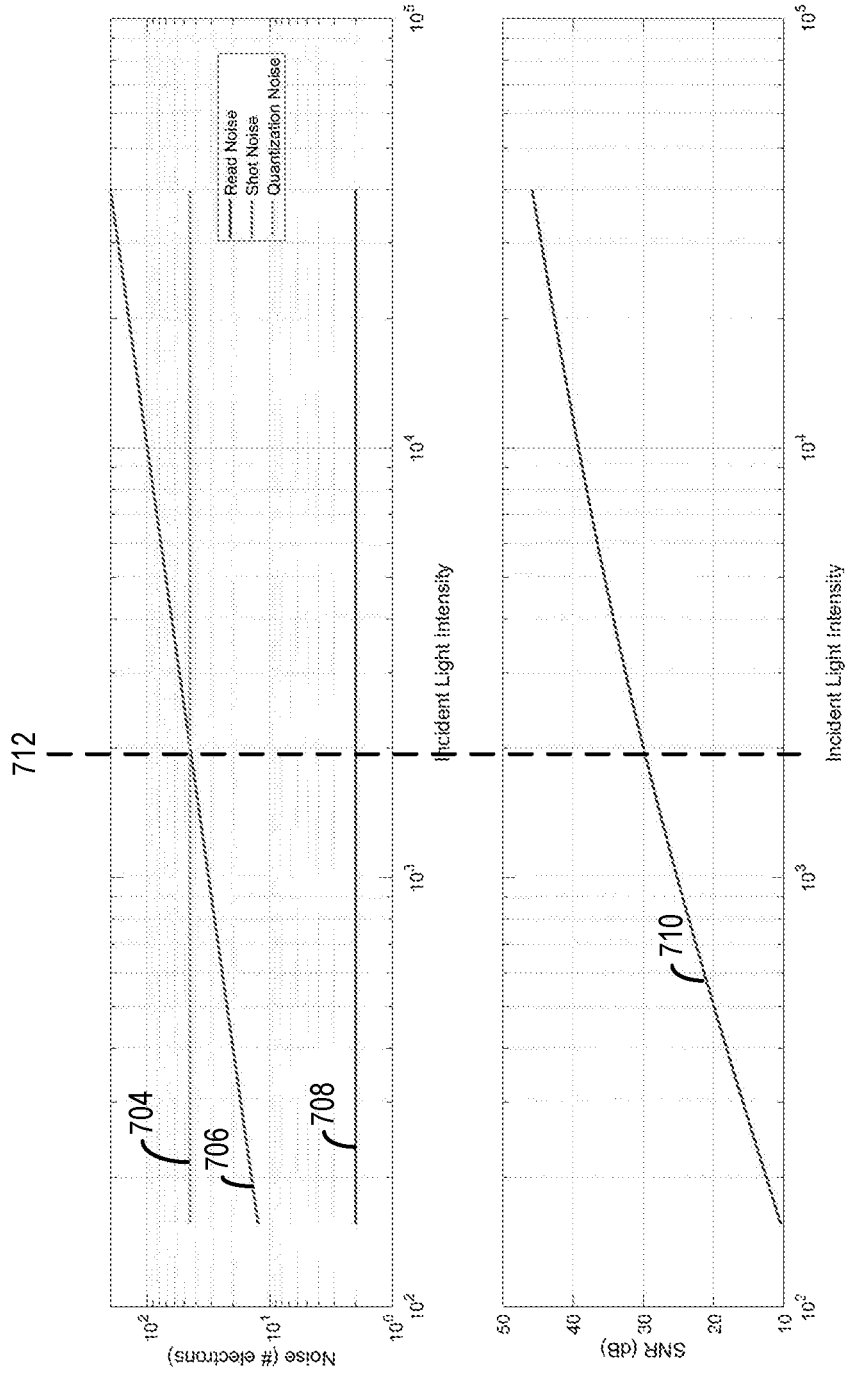

FIG. 7B provides an example plot of the magnitudes of different noises, as well as signal-to-noise ratio (SNR), with respect to incident light intensity when a uniform quantization scheme is used to quantize incident light intensity measurements. Graph 704 illustrates an example relationship between quantization noise and incident light intensity. Graph 706 illustrates an example relationship between shot noise and incident light intensity, whereas graph 708 illustrates an example relationship between read noise and incident light intensity. Further graph 710 illustrates an example relationship between SNR with respect to incident light intensity, with SNR calculated based on a ratio between detected incident light power and the combined noise power of quantization noise, shot noise, and read noise of graphs 704-708.

As shown in FIG. 7B, both quantization noise and read noise are constant with respect to the incident light intensity, whereas the shot noise increases with incident light intensity. Quantization noise can stay constant due to a uniform quantization scheme being used to quantize the incident light measurement. As the quantization step size stays constant, the quantization error also stays constant with respect to incident light intensity. Moreover, read noise can be mostly contributed by the thermal noise of the devices of the pixel cell sensor and, assuming that the temperature of the ADC does not increase with incident light intensity, the read noise can also stay constant with respect to incident light intensity. In contrast, shot noise can be caused by random conversion of photons into photo-electrons, and the quantity of shot noise (e.g., measured based on the number of photo-electrons generated) can increase with the incident light intensity, as more photons are received by the photodiode of the pixel cell sensor and are converted into photo-electrons. As a result, for measurement of relatively low incident light intensity (e.g., below a threshold 712), the quantization noise can dominate, while for measurement of relatively high incident light intensity (e.g., above threshold 712), the shot noise can dominate.

The plot of SNR, as shown in graph 710, can also reflect the aforementioned change in the relative contribution of various noise sources with respect to incident light intensity. For example, for relatively low incident light intensity (e.g., below threshold 712), the low incident light power combined with the relatively high quantization noise can lead to a relatively low SNR. As the incident light intensity increases, the contribution of quantization noise to the total noise power reduces with respect to shot noise. While shot noise increases, the incident light power also increases, and the SNR increases.

Figure 7C:
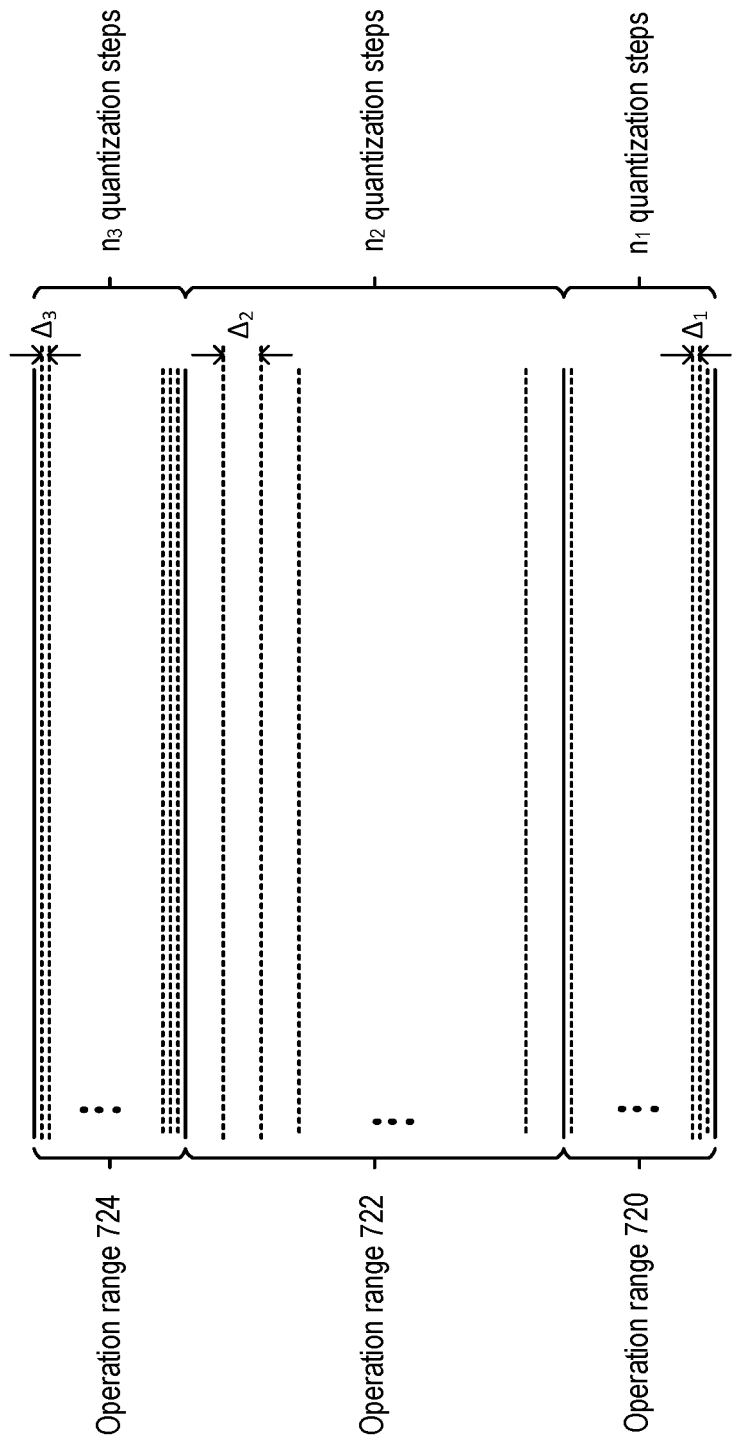

To further improve SNR, especially for measurement of low light intensity, an non-uniform quantization scheme can be used to perform quantization of measurements of incident light. The non-uniform quantization scheme can be configured such that relatively small quantization steps are used to quantize measurements of incident light of relatively low intensity. Moreover, relatively large quantization steps can be used to quantize measurements of incident light of relatively high intensity, where the contribution of quantization errors is small compared with shot noise and the SNR is relatively high due to the relatively large incident light power. Such arrangements can also keep the total number of quantization steps at N such that the number of bits of digital output code can be maintained at $\log_2(N)$. FIG. 7C illustrates an example of an non-uniform quantization scheme. In the example of FIG. 7C, a pre-determined number of quantization steps (out of the N quantization steps) can be allocated to one or more quantization operation subranges, such that the quantization operation subranges have different quantization step sizes. For example, quantization operation subrange 720 has a quantization step size of $\Delta_1$, quantization operation subrange 722 has a quantization step size of $\Delta_2$, whereas quantization operation subrange 724 has a quantization step size of $\Delta_3$. The quantization step size $\Delta_2$ is larger than $\Delta_1$ and $\Delta_3$, such that an input that falls within quantization operation subrange 722 is quantized at a lower quantization precision than when an input that falls within quantization operation subranges 720 or 724. Quantization operation subrange 720 has $n_1$ number of quantization steps, quantization operation subrange 722 has $n_2$ number of quantization steps, whereas quantization operation subrange 724 has $n_3$ number of quantization steps, with $n_1$ and $n_3$ being larger than $n_2$, and the sum of $n_1$, $n_2$, and $n_3$ equals N.

To improve operation flexibility, the non-uniform quantization scheme can be variable, in which at least one of the number of quantization steps (the quantization resolution) in each quantization operation subrange, or the boundaries of each quantization operation subrange, can be programmable. Moreover, the quantization resolution and the associated quantization operation subrange can also be separately programmable. The programming can be based on, for example, prioritizing the quantization operation subrange(s) the pixel ADC is likely to operate in, and a target quantization resolution for the prioritized quantization operation subrange(s). The prioritized quantization operation subrange(s) can correspond to, for example, an intensity range of light which pixel cell 600 is likely to receive under a particular operation condition. Different quantization operation subranges can be identified for different operation conditions, and the number of quantization steps can be maximized for the different quantization operation subranges. With such arrangements, the quantization resolution of pixel ADC 610 can be improved across different operation conditions.

Figure 7D:
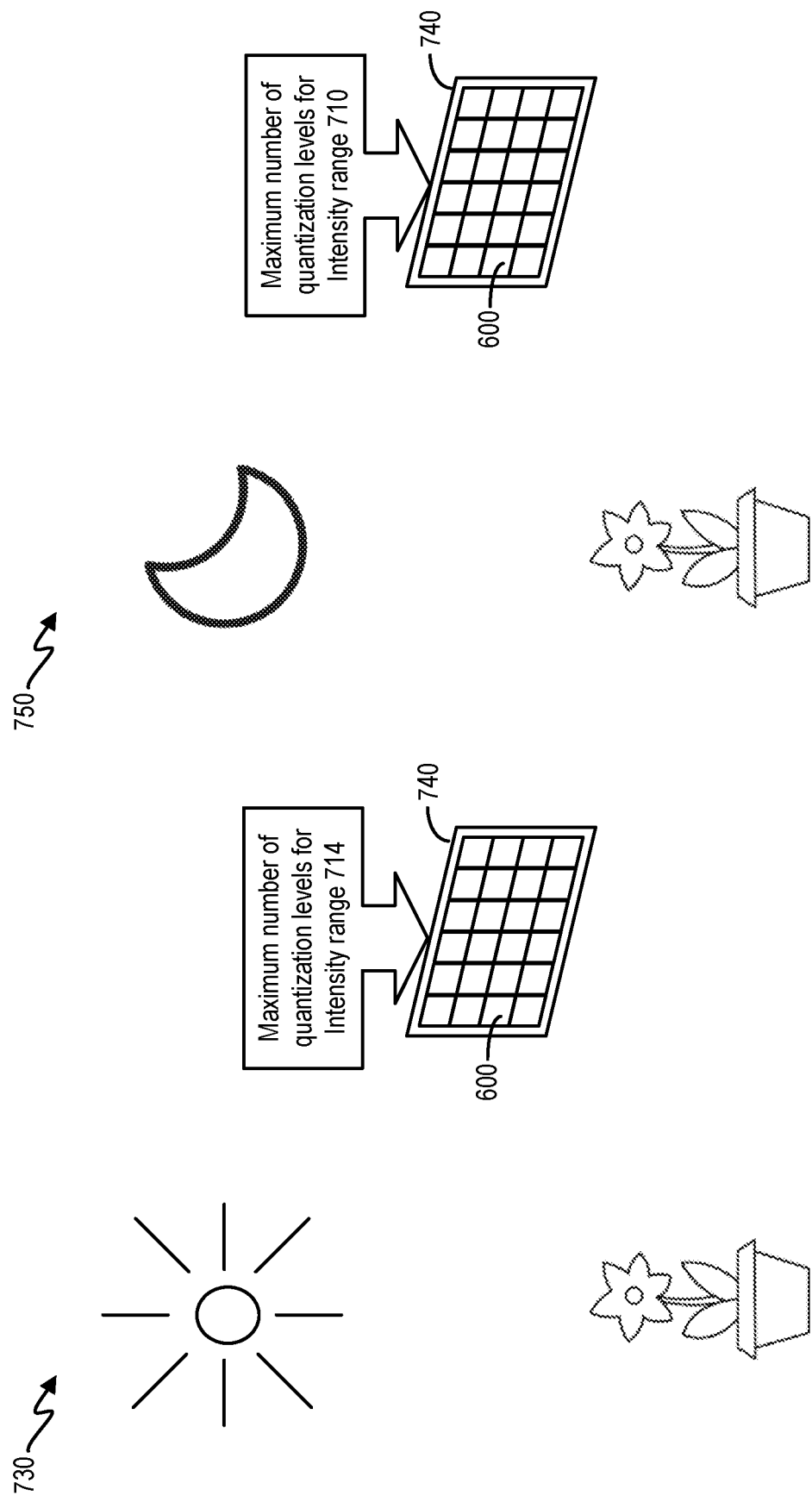

In some examples, each pixel cell 600 of the pixel cell array can be programmed to have the same quantization resolution for a particular quantization operation range, and the common quantization resolution can change based on the operation condition. For example, referring to FIG. 7D, under operation condition 730 (e.g., outdoor during daytime with strong ambient light), programmable configuration module 640 of each pixel cell 600 of pixel cell array 740 can be programmed to have an identical maximum number of quantization levels for, for example, high light intensity range 714, based on an assumption that light received by each pixel cell 600 is likely to fall within high light intensity range 714. Further, under operation condition 750 (e.g., outdoor during nightlight with weak ambient light), each pixel cell 600 of pixel cell array 740 can be programmed to have an identical maximum number of quantization levels for, for example, low light intensity range 710, based on an assumption that light received by each pixel cell 600 is likely to fall within low light intensity range 710. In some examples, the programming can be performed manually (e.g., by a person operating pixel cell array 750 to capture images). In some examples, the programming can also be performed automatically (e.g., by an application of application store 545) based on, for example, the output of a light sensor that senses ambient light.

Figure 7E:
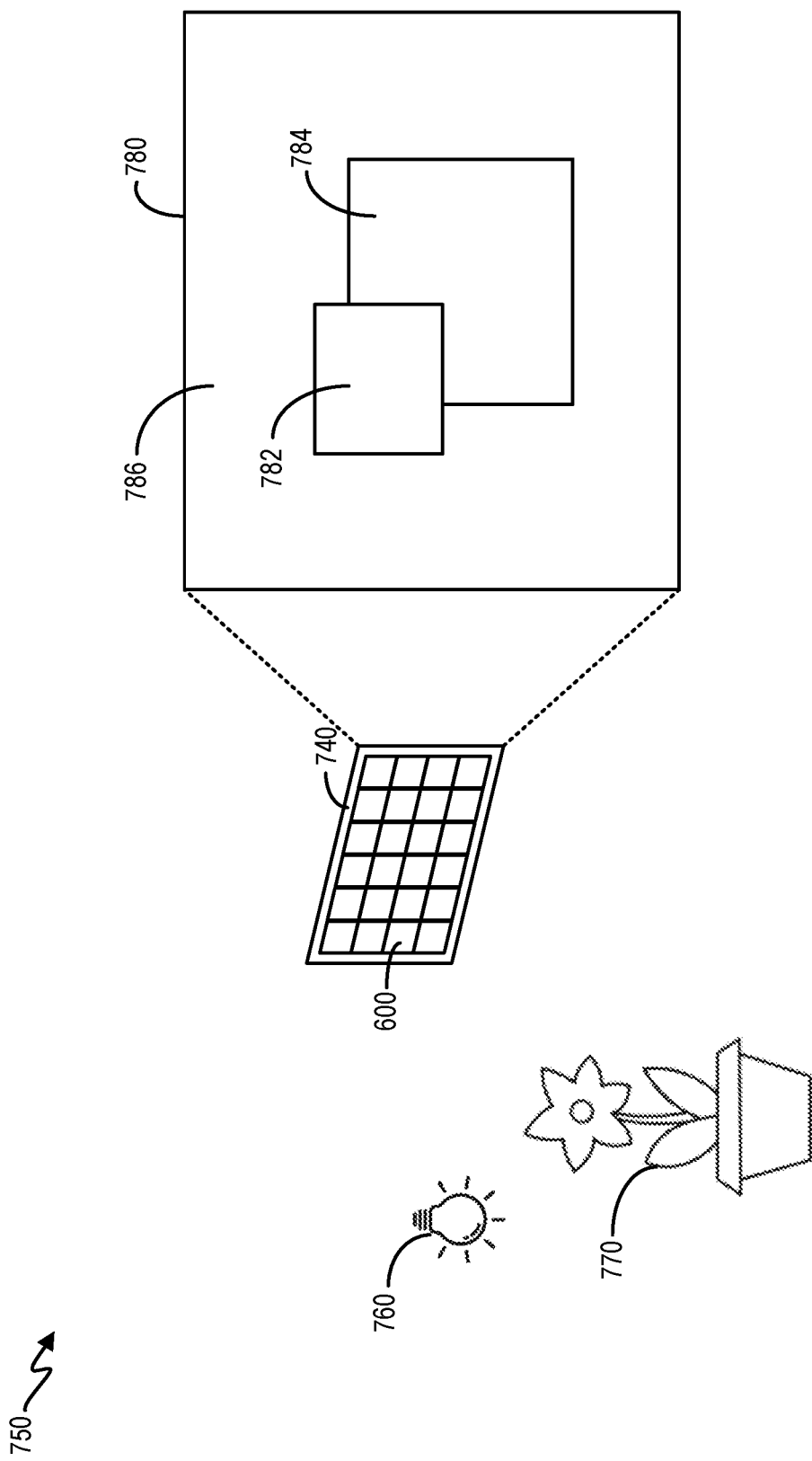

In some examples, different regions of pixel cells 600 of the pixel cell array (e.g., pixel cell array 740) can also be programmed to maximize the quantization resolution for a particular quantization operation range in which pixel cell ADC 610 is most likely to operate. This can be based on an assumption that different regions of the pixel cell array are likely to receive light of different intensity ranges. The pixel cells within each region can be programmed to maximize the quantization resolution for the intensity range of light the pixel cells are likely to receive. For example, referring to FIG. 7E, under operation 750, pixel cell array 740 may be operated to capture a scene of an outdoor environment during night time, and the outdoor environment comprises a light source 760 and an object 770. An image 780 captured by pixel cell array 740 may include, for example, an image region 782 of high light intensity (e.g., corresponding to an image of light source 760), an image region 784 of medium light intensity (e.g., corresponding to an image of object 770), and an image region 786 of low light intensity (e.g., corresponding to the nighttime background).

As part of operation 750, programmable configuration module 640 of the pixel cells 600 corresponding to image region 782 can be programmed to maximize the quantization resolution for high light intensity range 714, programmable configuration module 640 of the pixel cells 600 corresponding to image region 784 can be programmed to maximize the quantization resolution for medium light intensity range 712, whereas programmable configuration module 640 of the pixel cells 600 corresponding to image region 786 can be programmed to maximize the quantization resolution for low light intensity range 710. In some examples, the programming can be performed automatically (e.g., by an application of application store 545) when capturing a sequence of images under operation 750. For example, the application can program each pixel cell 600 to quantize the incident light intensity using a default quantization scheme (e.g., an uniform quantization scheme shown in FIG. 7A) to generate a first image of the scene. From the first image, the application can identify image regions that fall into one of low light intensity range 710, medium light intensity range 712, and high light intensity range 714. The application can then program the pixel cells 600 of each of the identified region to maximize the quantization resolution for the light intensity range the identified region belongs to for capturing of subsequent images of the scene.

Figure 7F:
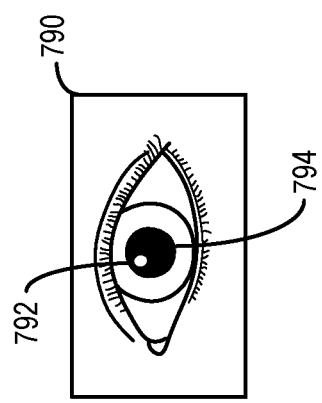

In some examples, programmable configuration module 640 of each pixel cell 600 of pixel cell array 740 can also be programmed to maximize the quantization resolution for high light intensity range 714 and for low light intensity range 710, whereas the quantization resolution for medium light intensity range 712 can be reduced. One example where such arrangements can be useful is for gaze point determination. As shown in FIG. 7F, pixel cell array 740 can be used to capture an image 790 of an eye ball, and image 790 may include a glint patch 792 and a pupil patch 794. Glint patch 792 may be generated based on detection of high intensity light reflected off the cornea surface of the eyeball, whereas pupil patch 794 may be generated based on detection of low intensity light reflected off the pupil of the eyeball. A gaze direction of the user can be determined based on the image locations of glint patch 792 and pupil patch 794 within image 790. To improve the accuracy of detection of the glint patches and pupil patches, which in turns improves the tracking of the gaze direction, the quantization resolution for high light intensity range 714 (to quantize high intensity light reflected off the cornea surface of the eyeball) and for low light intensity range 710 (to quantize low intensity light reflected off the pupil of the eyeball) can be maximized. On the other hand, given that the gaze direction determination does not rely on the image of other parts of the eyeball, which may be generated based on detection of light of medium intensity range, the quantization resolution for medium light intensity range 712 can be reduced.

FIG. 8 illustrates an example of the internal components of quantizer 630. As shown in FIG. 8, quantizer 630 includes a threshold generator 802, a comparator 804, and a digital output generator 806. Digital output generator 806 may further include a counter 808 and a memory device 810. Counter 808 can generate a set of count values based on a clock signal 812 which, in some examples, can be provided from programmable configuration module 640. memory 810 can store a count value generated by counter 808. In some embodiments, memory 810 may be part of counter 808. Memory 810 can be, for example, a latch circuit to store the counter value based on local pixel value as described below.

Comparator 804 can compare the analog voltage developed at analog output node 614 against the threshold provided by threshold generator 802, and generate a decision 816 based on the comparison result. For example, comparator 804 can generate a logical one for decision 816 if the analog voltage at analog output node 614 equals to or exceeds the threshold generated by threshold generator 802. Comparator 804 can also generate a logical zero for decision 816 if the analog voltage falls below the threshold. Decision 816 can control the counting operations of counter 808 and the count values stored in memory 810. For example, when decision 816 is a logical zero, counter 808 can keep incrementing (or decrementing) a count value for each clock cycle of clock signal 812. When decision 816 transitions from logical zero to logical one, counter 808 can stop, and memory 810 can store the count value after counting the clock cycle of clock signal 812 immediately after the transition of decision 816.

Figure 8A:
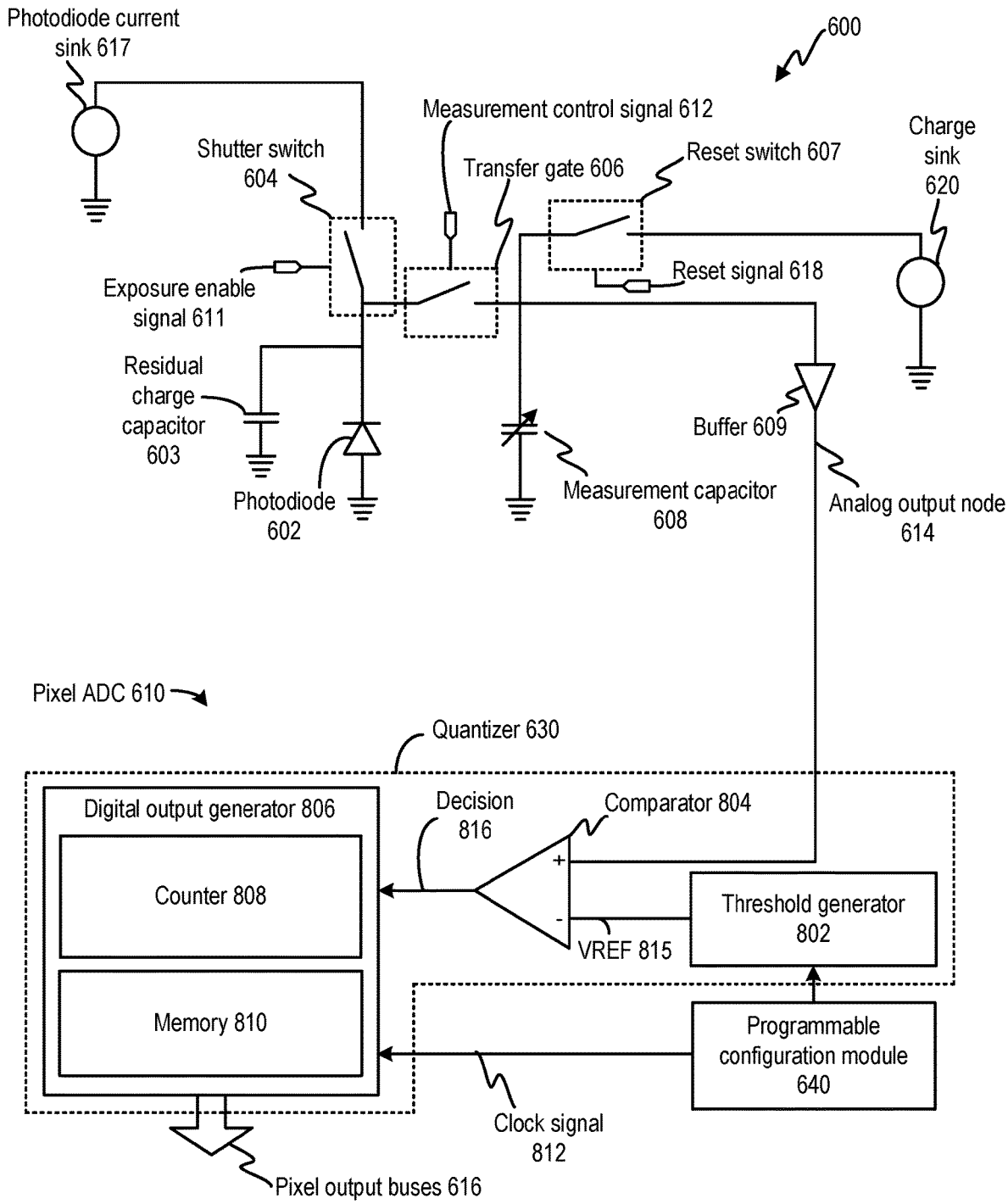
FIGS. 8A, 8B, and 8C illustrate examples of internal components and operations of the pixel cell of FIG. 6.
Figure 8C:
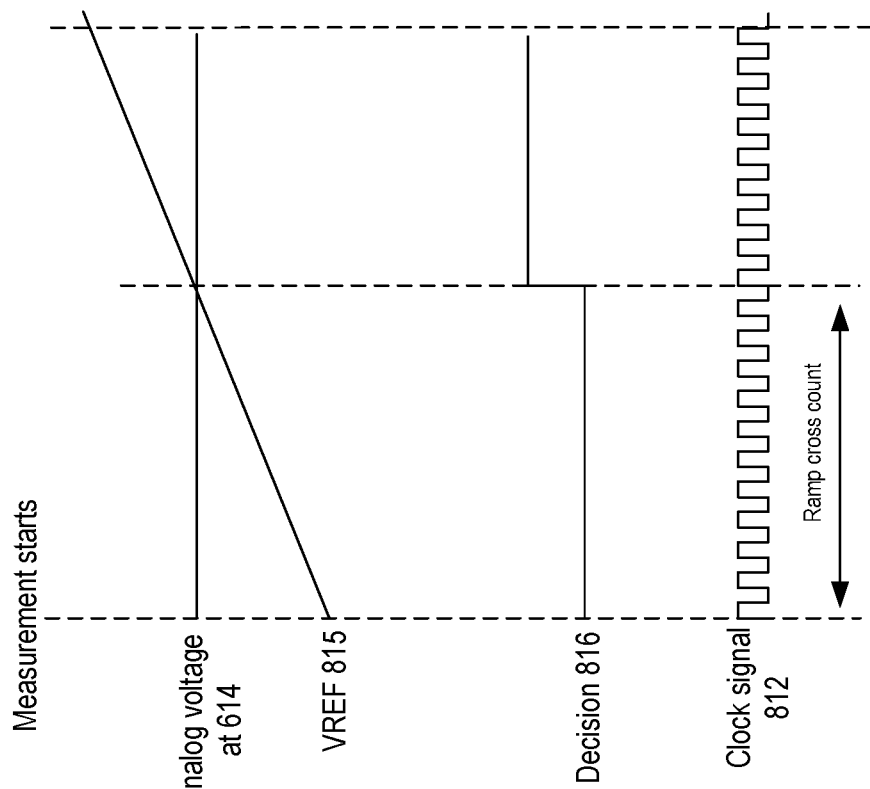
Figure 8B:
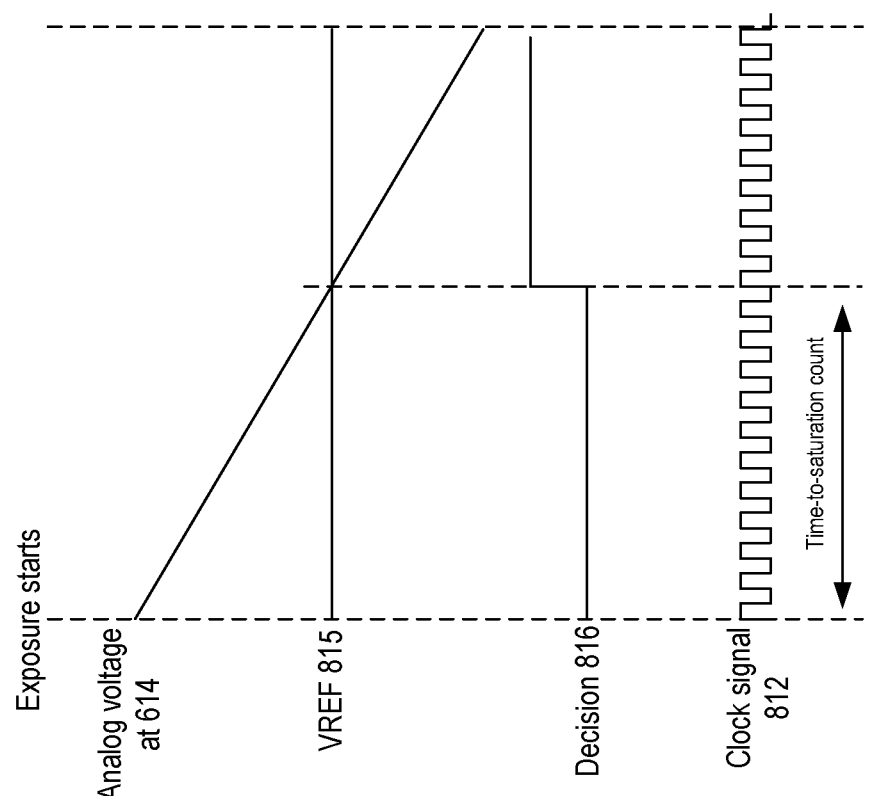

Depending on a measurement mode of pixel ADC 610, threshold generator 802 can provide either a voltage ramp or a static voltage as a reference voltage (VREF) 815 to comparator 804 to be compared against the voltage at analog output node 614 to generate decision 816. FIG. 8B and FIG. 8C illustrates two examples of measurement modes. FIG. 8B illustrates an example of a time-to-saturation measurement mode of quantizer 630. Time-to-saturation measurement can be performed for measurement of incident light of high intensity range where measurement capacitor 608 becomes saturated and stops accepting new charges, and the voltage at measurement capacitor 608 may not correlate to the intensity of the incident light. In a time-of-saturation operation, a time duration for the total charge at measurement capacitor 608 to reach a saturation threshold (e.g., between medium light intensity range 712 and high light intensity range 714 of FIG. 7B) can be measured. The time duration can reflect the intensity of light received at pixel cell 600. For example, the light intensity can be inversely proportional to the time duration, with a higher light intensity lead to a shorter time-to-saturation, and vice versa for a lower light intensity.

Referring back to FIG. 6, time-to-saturation measurement can be performed during an exposure period, when photodiode 602 is exposed to light and charges are transferred to measurement capacitor 608 with shutter switch 604 disabled and transfer gate 606 enabled. Charges generated by the photodiode may continue to accumulate, and a ramping voltage at analog output node 614 may result. To perform the time-to-saturation measurement, threshold generator 802 can provide a fixed VREF 815. Fixed VREF 815 can be set at a voltage corresponding to the saturation threshold. Counter 808 can start counting right after the exposure period starts (e.g., right after shutter switch 604 is disabled). As the analog voltage at analog output node 614 ramps down (or up depending on the implementation), clock signal 812 keeps toggling to update the count value at counter 808. The analog voltage may reach the fixed threshold at a certain time point, which causes decision 816 by comparator 804 to flip. The flipping of decision 816 may stop the counting of counter 808, and the count value at counter 808 may represent the time-to-saturation.

FIG. 8C illustrates an example of a static voltage measurement mode of quantizer 630. Static voltage measurement can be performed for measurement of incident light of low and medium intensity ranges where measurement capacitor 608 accepts charges and the voltage at measurement capacitor 608 correlates to the intensity of the incident light. In a static voltage measurement, the voltage at measurement capacitor 608 after the exposure period ends can become static, and the static voltage can be measured against a ramping VREF 815. The voltage of ramping VREF 815 can be a function of time, which can be measured by the count value at counter 808, and the voltage range of ramping VREF 815 can cover a range of intensity of light to be measured. When VREF 815 reaches within one quantization step of the analog voltage at analog output node 614, decision 816 by comparator 804 flips. The flipping of decision 816 may stop the counting of counter 808, and the count value can indicate the closest value of ramping VREF 815 to the analog voltage. The count value can become a digital representation of the quantity of charges stored at measurement capacitor 608, as well as the digital representation of the incident light intensity.

In the static voltage measurement mode, the quantization step size can be represented by the following equation:

$$\text{Step size} = \frac{\partial V_{ramp}}{\partial t} * \frac{t_{CLK}}{DN} \quad \text{(Equation 1)}$$

In equation 1, $$\frac{\partial V_{ramp}}{\partial t}$$

can refer to the ramp rate (e.g., slope) of ramping VREF 815 whereas $t_{CLK}$ can refer to a clock period of clock signal 812, and a product of $$\frac{\partial V_{ramp}}{\partial t}$$

and $t_{CLK}$ provides a voltage range to be represented by a range of count value DN. The step size (in the units of volts) can be determined by dividing the voltage range by the count value range. In a case where counter 808 increments or decrements by one for each clock period of clock signal 812, DN can be equal to one. The quantization resolution can be increased by reducing the step size, which can be achieved by decreasing the ramp rate of ramping VREF 815, by increasing the clock period $t_{CLK}$, or by a combination of the two. Referring to FIG. 8A, to support a variable quantization scheme in the static voltage measurement mode, programmable configuration module 640 can be programmed to change the clock period $t_{CLK}$ of clock signal 812 and/or the ramp rate of ramping VREF 815 to produce different quantization step sizes for different quantization operation ranges.

Figure 9A:
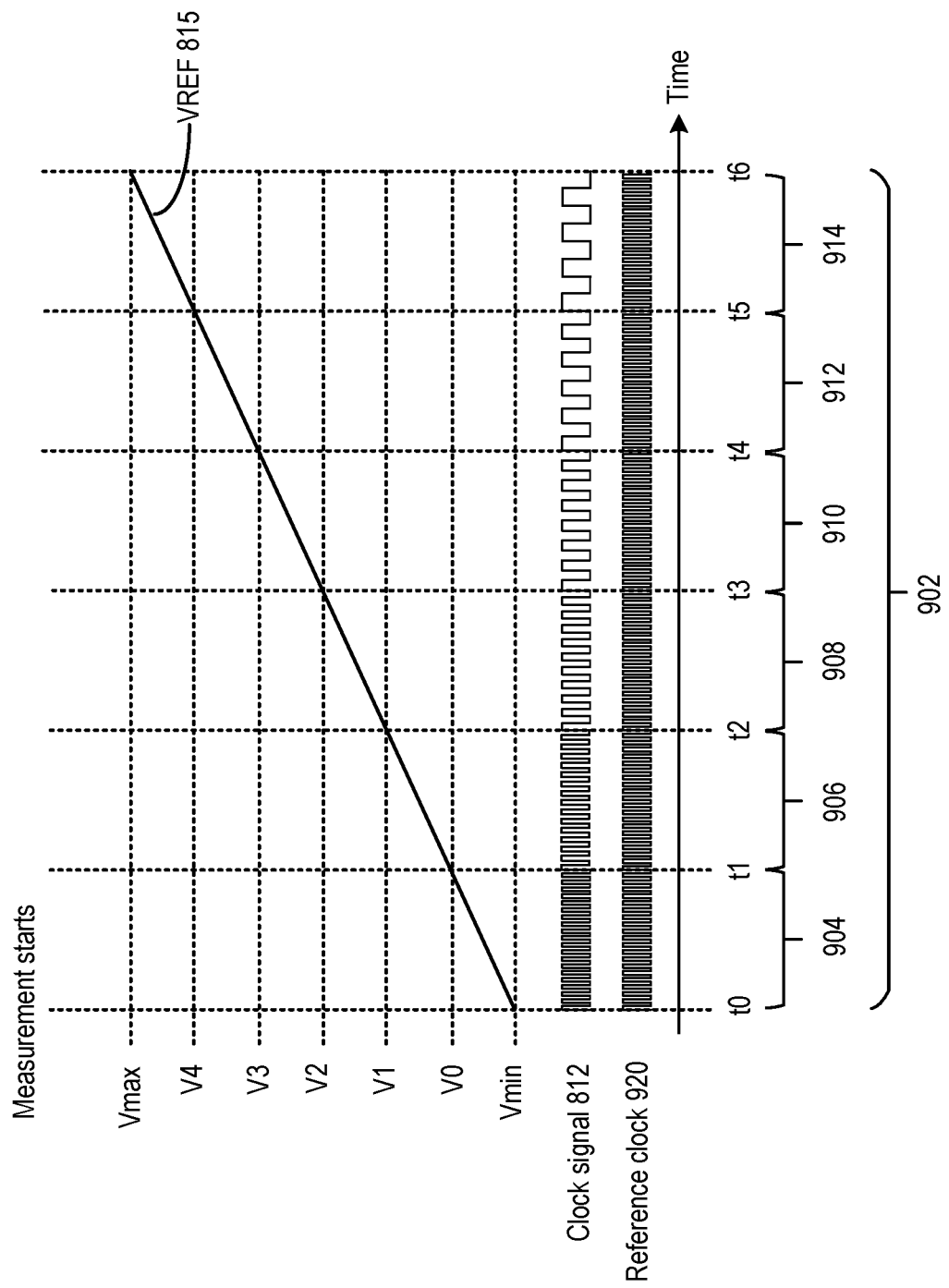
FIGS. 9A, 9B, and 9C illustrate example techniques for performing quantization.

FIG. 9A illustrates an example of an non-uniform quantization scheme which pixel ADC 610 can be programmed to perform for the static voltage measurement mode of FIG. 8B. As shown in FIG. 9A, measurement starts at time t0. The ramp rate of ramping VREF 815 can be made constant across an quantization operation range 902 defined by times t0 and t6, and the voltage range (from Vmin to Vmax) of ramping VREF 815 defines the input voltage range to be quantized. Quantization operation range 902 is further subdivided into a plurality of quantization operation subranges including a quantization operation subrange 904 defined by times t0 and t1, a quantization operation subrange 906 defined by times t1 and t2, a quantization operation subrange 908 defined by times t2 and t3, a quantization operation subrange 910 defined by times t3 and t4, a quantization operation subrange 912 defined by times t4 and t5, and a quantization operation subrange 914 defined by times t5 and t6. Each quantization operation range corresponds to a voltage subrange of VREF 815 and covers a subrange of a range of light intensity to be measured. For example, quantization operation subrange 904 corresponds to a voltage subrange from Vmin to V0 (which can cover the lowest intensity subrange of light to be measured), quantization operation subrange 906 corresponds to a voltage subrange from V0 to V1, quantization operation subrange 908 corresponds to a voltage subrange from V1 to V2, quantization operation subrange 910 corresponds to a voltage subrange from V2 to V3, quantization operation subrange 912 corresponds to a voltage subrange from V3 to V4, whereas quantization operation subrange 914 corresponds to a voltage subrange from V4 to V5 (which can cover the highest intensity subrange of light to be measured). The ramp rate of VREF 815 in each of the quantization operation subranges is identical.

As shown in FIG. 9A, for each quantization subrange, the clock period of clock signal 812 can be set to be different to provide different quantization resolutions for quantizing an input voltage. For example, as shown in FIG. 9A, the clock period for clock signal 812 can be set the smallest (having the highest clock frequency) for quantization operation subrange 904 covering for the lowest light intensity subrange. The clock period for clock signal 812 can be set progressively higher for other quantization operation subranges covering for higher light intensity subranges, with the clock period for clock signal 812 set to the highest (having the lowest clock frequency) for quantization operation subrange 914. On the other hand, VREF 815 can be generated based on a reference clock signal 920 having a fixed clock period (and frequency) to have a uniform ramp rate. Programmable configuration module 640 can also use reference clock signal 920 to measure a time to determine whether the end boundary of a current quantization operation subrange has been reached, and to switch the clock period of clock signal 812 for the next quantization operation subrange. With such arrangements, the quantization resolution for quantizing an input voltage corresponding to a lower light intensity subrange (e.g., corresponding to quantization operation subrange 904) can be quantized with a higher quantization resolution to reduce quantization error.

Figure 9B:
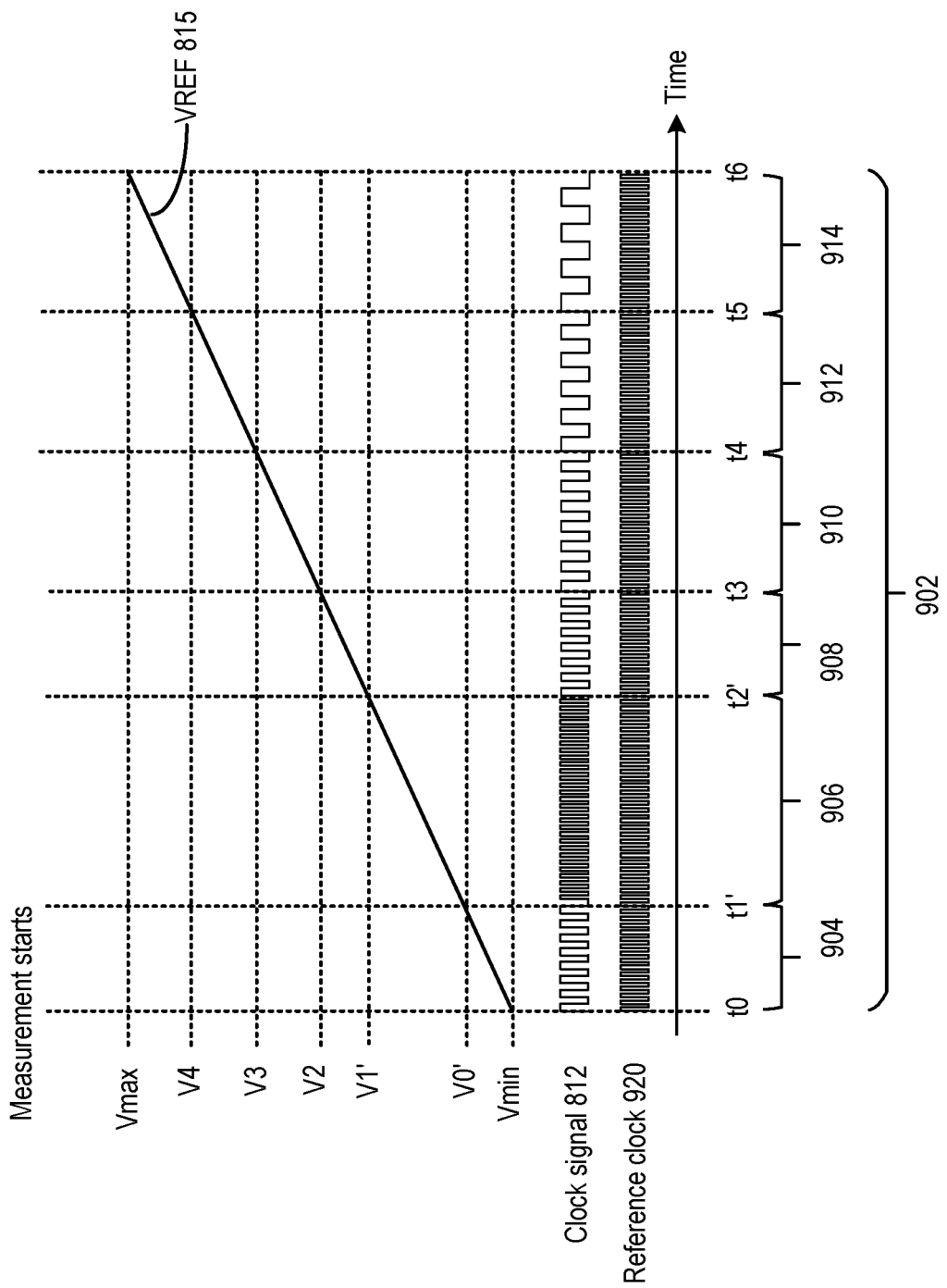

As part of a variable quantization scheme, the clock periods for each quantization operation subrange, as well as the boundaries for each quantization operation subrange, can be adjusted by programming. FIG. 9B illustrates another example of an non-uniform quantization scheme which pixel ADC 610 can be programmed to perform for the static voltage measurement mode of FIG. 8B. For example, as shown in FIG. 9B, the clock period for quantization operation subrange 906 can be made the smallest to provide the highest quantization resolution for that subrange. The boundaries of quantization operation subrange 906 can also be changed from being t1 to t2 to being t1' to t2' in the time domain, and from being V0 to V1 to being V0' to V1' in the voltage domain. The programming can be used for operation conditions 730 and 750 of FIG. 7D and FIG. 7E, and can be based on, for example, a determination that the pixel cell is most likely to receive light having an intensity that falls within the subrange of light intensity corresponding to quantization operation subrange 906, such that priority is given to minimize the quantization error for quantization operation subrange 906.

Figure 9C:
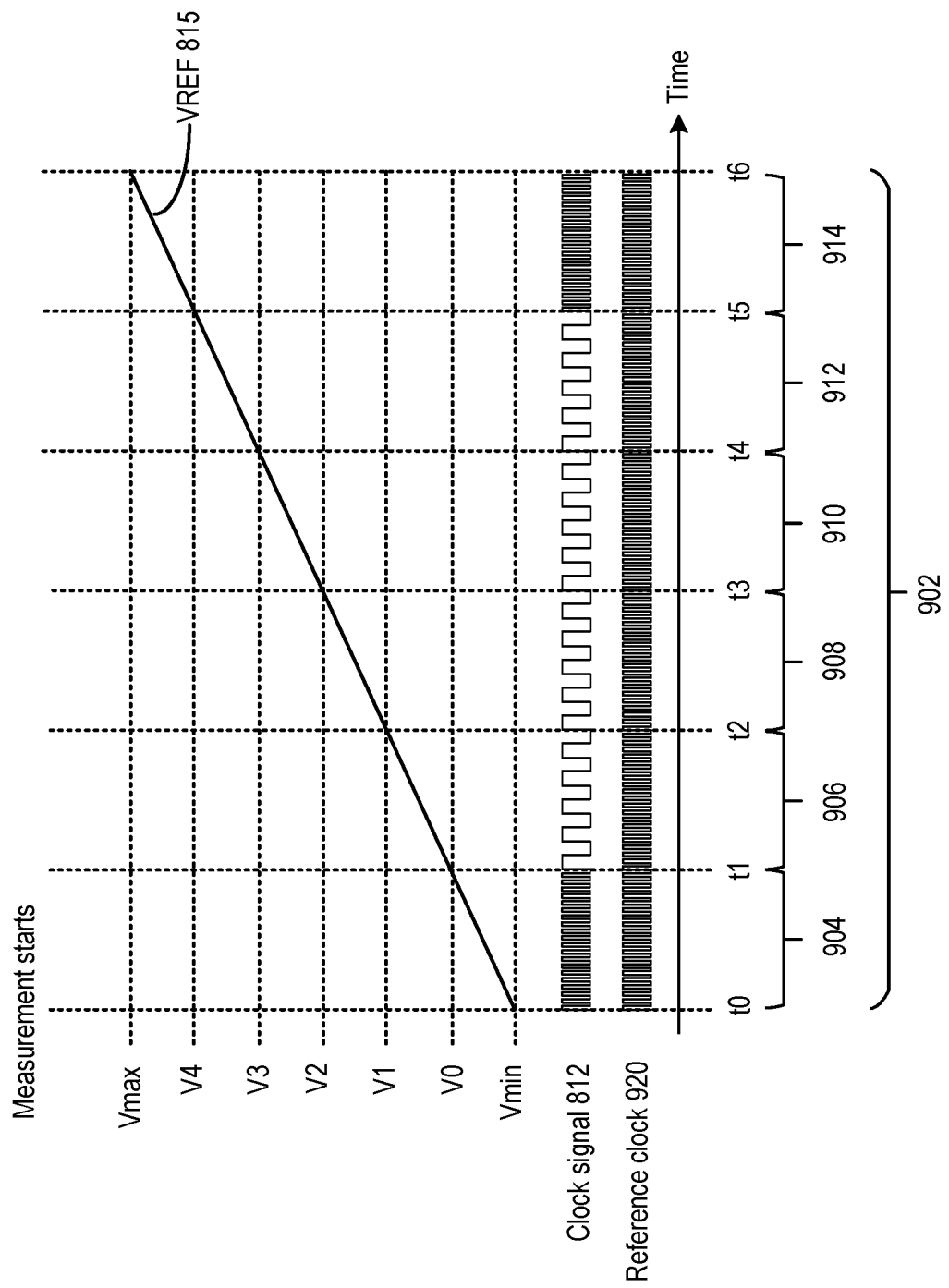

FIG. 9C illustrates another example of an non-uniform quantization scheme which pixel ADC 610 can be programmed to perform for the static voltage measurement mode of FIG. 8B. The non-uniform quantization scheme can be performed for the gaze determination operation of FIG. 7F. As shown in FIG. 9C, the clock period for quantization operation subranges 904 and 914 can be made the smallest to provide the highest quantization resolution for those subranges. Quantization operation subrange 904 can be configured to quantize light that falls within low light intensity range 710, whereas quantization operation subrange 914 can be configured to quantize light that falls within high light intensity range 714. The programming can be based on, for example, light for glint patch 792 is likely to be quantized within quantization subrange 914, and light for pupil patch 794 is likely to be quantized within quantization subrange 904.

Figure 10:
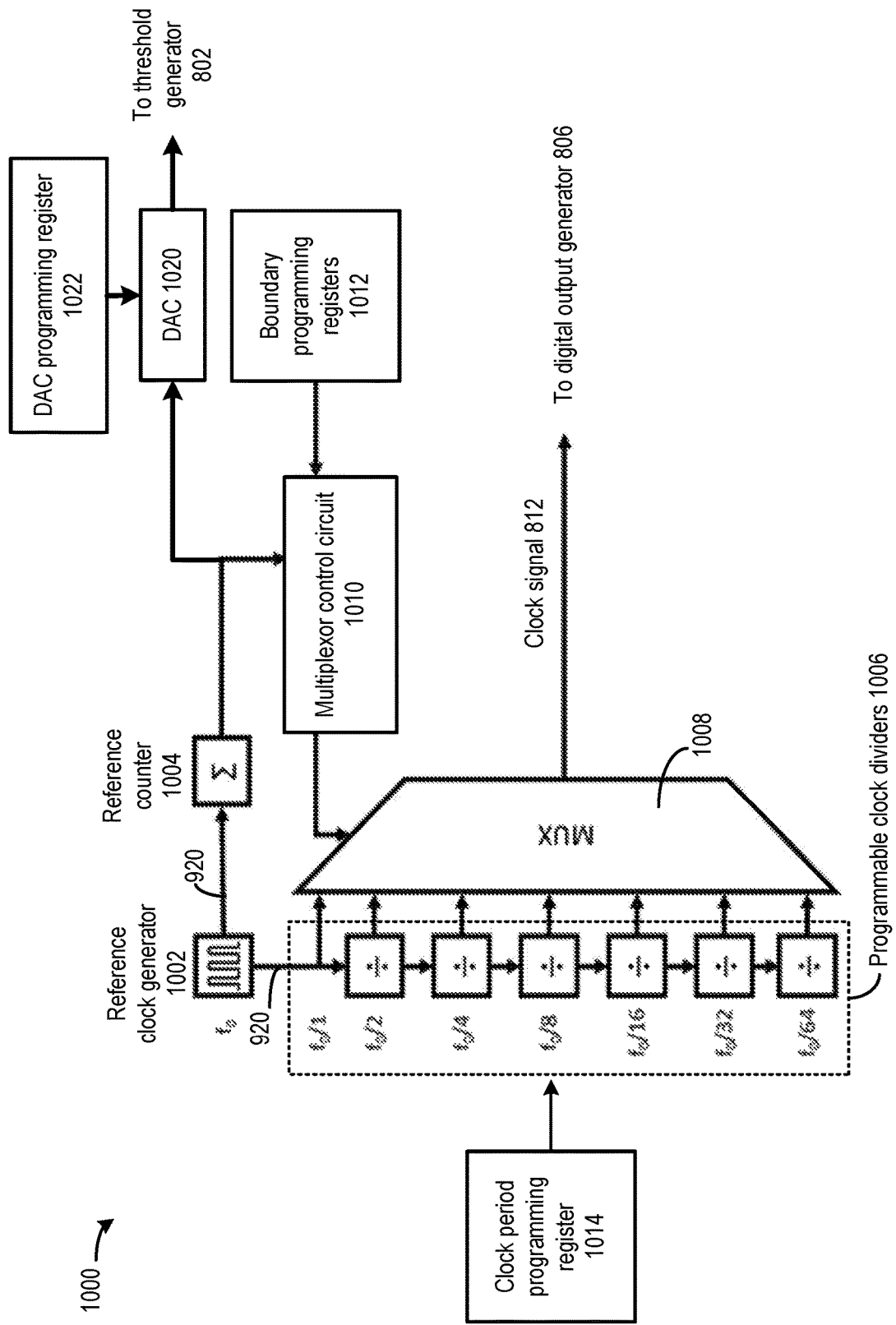
FIG. 10 illustrate an example of a clock modulation system for implementing the example techniques of FIGS. 9A, 9B, and 9C.

FIG. 10 illustrates an example of a clock modulation system 1000 that can be included in programmable configuration module 640 to support the non-uniform quantization schemes described in FIG. 9A and FIG. 9B. As shown in FIG. 10, clock modulation system 1000 includes a reference clock generator 1002, a reference counter 1004, a set of programmable clock dividers 1006, a multiplexor 1008, a multiplexor control circuit 1010, a boundary programming register 1012, a clock period programming register 1014, a digital-to-analog converter (DAC) 1020, and a DAC programming register 1022.

Reference clock generator 1002 can generate reference clock 920 which can be used to clock reference counter 1004. Reference clock 920 can also be provided to programmable clock dividers 1006 to generate a set of candidate clock signals each being a divided down version (e.g., ½, ¼, ⅛, etc.) of reference clock 920. Each of the candidate clock signals can be provided for a quantization operation subrange of FIG. 9A and FIG. 9B, and can be provided as to multiplexor 1008, which can select one of the set of candidate clock signals for outputting as clock signal 812 to digital output generator 806. The divide ratios of programmable clock dividers 1006 can be programmed based on the values stored in clock period programming register 1014, which can set the clock period for each quantization operation subrange.

In addition, reference clock 920 is also provided to reference counter 1004, which can update a count value for each clock period of reference clock 920 to provide a measurement of time. The measurement of time can be compared, at multiplexor control circuit 1010, against a set of time boundaries for each quantization operation range provided by boundary programming register 1012 to determine a current quantization operation range. Multiplexor control circuit 1010 can include a set of comparators to compare the count value from reference counter 1004 against a set of threshold counts representing a set of time boundaries of quantization operation subranges (e.g., t0, t1, t2, etc. of FIG. 9A and FIG. 9B). Multiplexor control circuit 1010 also includes logic circuits which can translate the outputs of the set of comparators to a decision of the current quantization operation range, and a corresponding selection input to multiplexor 1008 to select one of the set of candidate clock signals for outputting as clock signal 812 to digital output generator 806.

Further, the count value of reference counter 1004 is also provided to DAC 1020, which can generate an analog voltage based on the digital count value when the ADC operates in the static voltage measurement mode of FIG. 8C. As the count value is updated per fixed clock period of reference clock 920, the output of DAC 1020 can approximate a voltage ramp having a fixed ramp rate, and the output of DAC 1020 can be provided to threshold generator 802 to generate the ramping VREF 815 of FIG. 8C. In addition, DAC 1020 may also receive a fixed digital count value from DAC programming register 1022 to generate a flat VREF 815 to be used for time-to-saturation measurement of FIG. 8B. In some examples, instead of comparing the count values, multiplexor control circuit 1010 can also compare the output of DAC 1020 against a set of threshold voltages representing voltage boundaries of quantization operation subranges (e.g., V1, V2, V3, etc. of FIG. 9A and FIG. 9B), to determine a current quantization operation subrange and to set the clock period of clock signal 812.

Figure 11A:
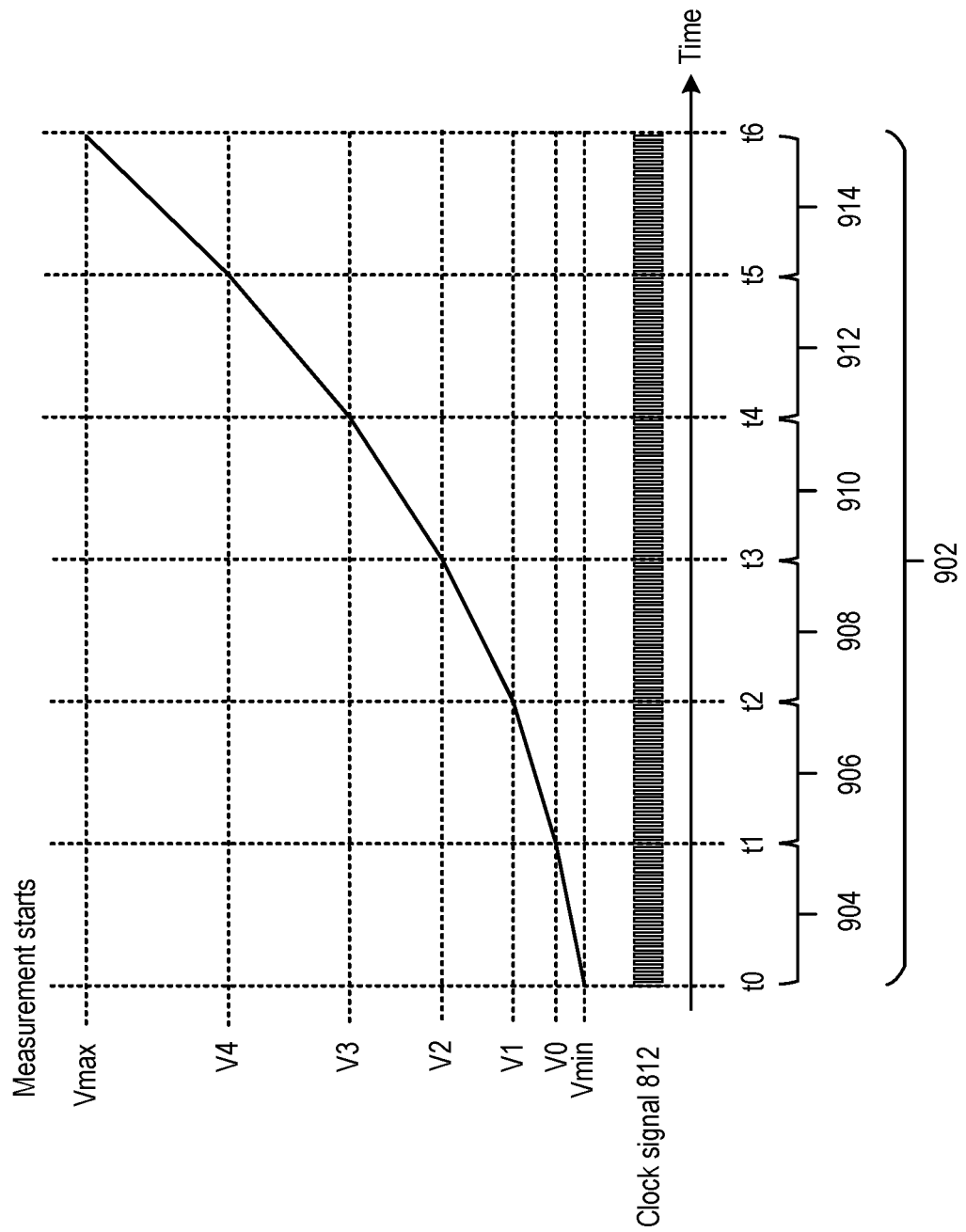
FIGS. 11A, 11B, and 11C illustrate example techniques for performing quantization.

FIG. 11A illustrates another example of an non-uniform quantization scheme which pixel ADC 610 can be programmed to perform for the static voltage measurement mode of FIG. 8B. As shown in FIG. 11A, measurement starts at time t0. The ramp rate of ramping VREF 815 can change across quantization operation range 902 defined by times t0 and t6, and the voltage range (from Vmin to Vmax) of ramping VREF 815 defines the input voltage range to be quantized. Just as FIG. 9A and FIG. 9B, quantization operation range 902 is further subdivided into quantization operation subranges 904, 906, 908, 910, 912, and 914, and each quantization operation range corresponds to a voltage subrange of VREF 815 and covers a subrange of a range of light intensity to be measured. The ramp rate of ramping VREF 815 can be made the smallest for voltage subrange from Vmin to V0 (which can cover the lowest intensity subrange of light to be measured), and the ramp rate can become progressively higher for higher voltage subranges. With such arrangements, the quantization resolution for quantizing an input voltage corresponding to a lower light intensity subrange (e.g., corresponding to quantization operation subrange 904) can be quantized with a higher quantization resolution to reduce quantization error.

Figure 11B:
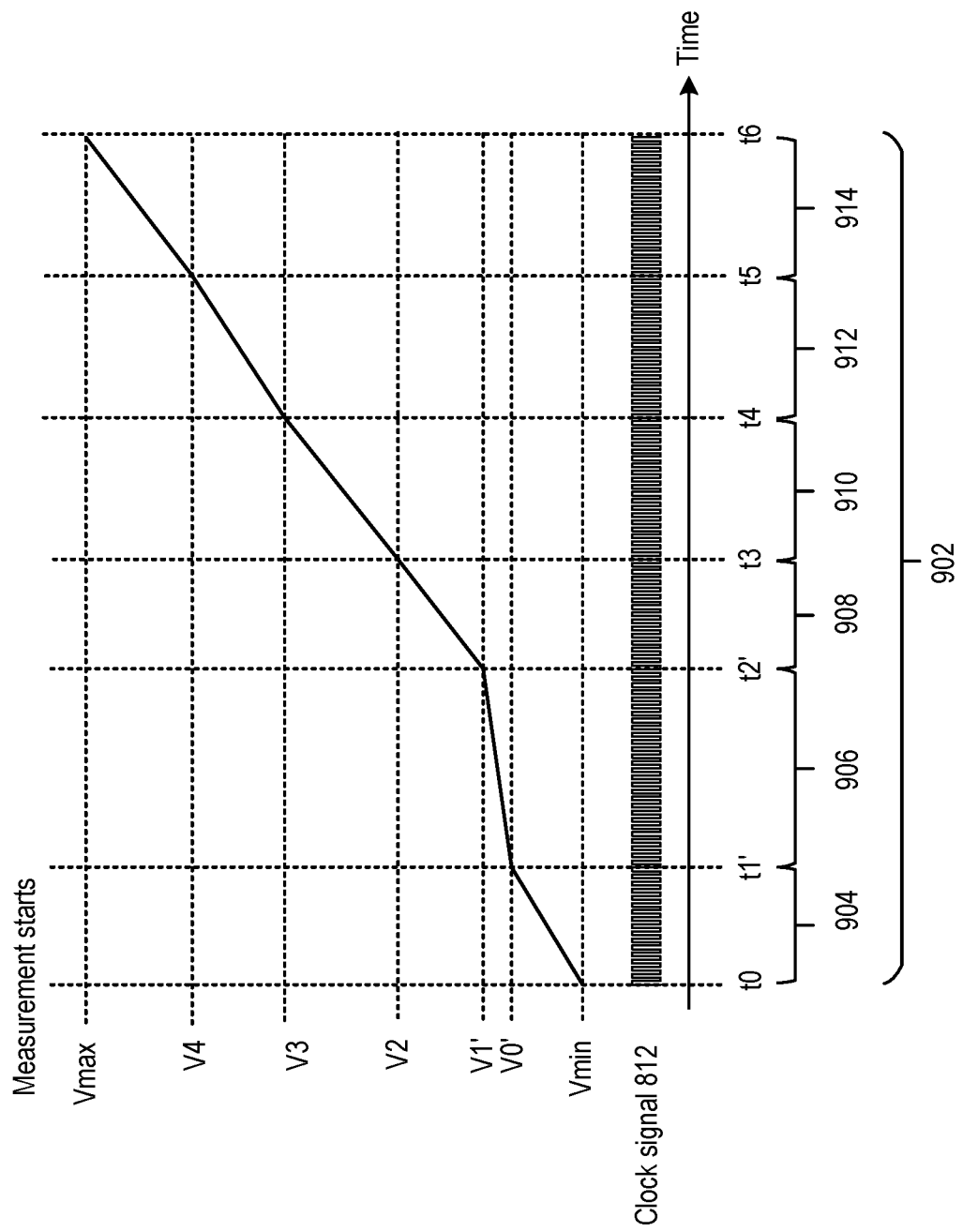

As part of a variable quantization scheme, the voltage ramp rate for each quantization operation subrange, as well as the time boundaries for each quantization operation subrange, can be adjusted by programming. FIG. 11B illustrates another example of an non-uniform quantization scheme which pixel ADC 610 can be programmed to perform for the static voltage measurement mode of FIG. 8B. As shown in FIG. 11B, the ramp rate of VREF 815 for quantization operation subrange 906 can be made the smallest to provide the highest quantization resolution for that subrange. The boundaries of quantization operation subrange 906 can also be changed from being t1 to t2 to being t1' to t2' in the time domain, and from being V0 to V1 to being V0' to V1' in the voltage domain. The programming can be used for operation conditions 730 and 750 of FIG. 7D and FIG. 7E, and can be based on, for example, a determination that the pixel cell is most likely to receive light having an intensity that falls within the subrange of light intensity corresponding to quantization operation subrange 906, such that priority is given to minimize the quantization error for quantization operation subrange 906.

Figure 11C:
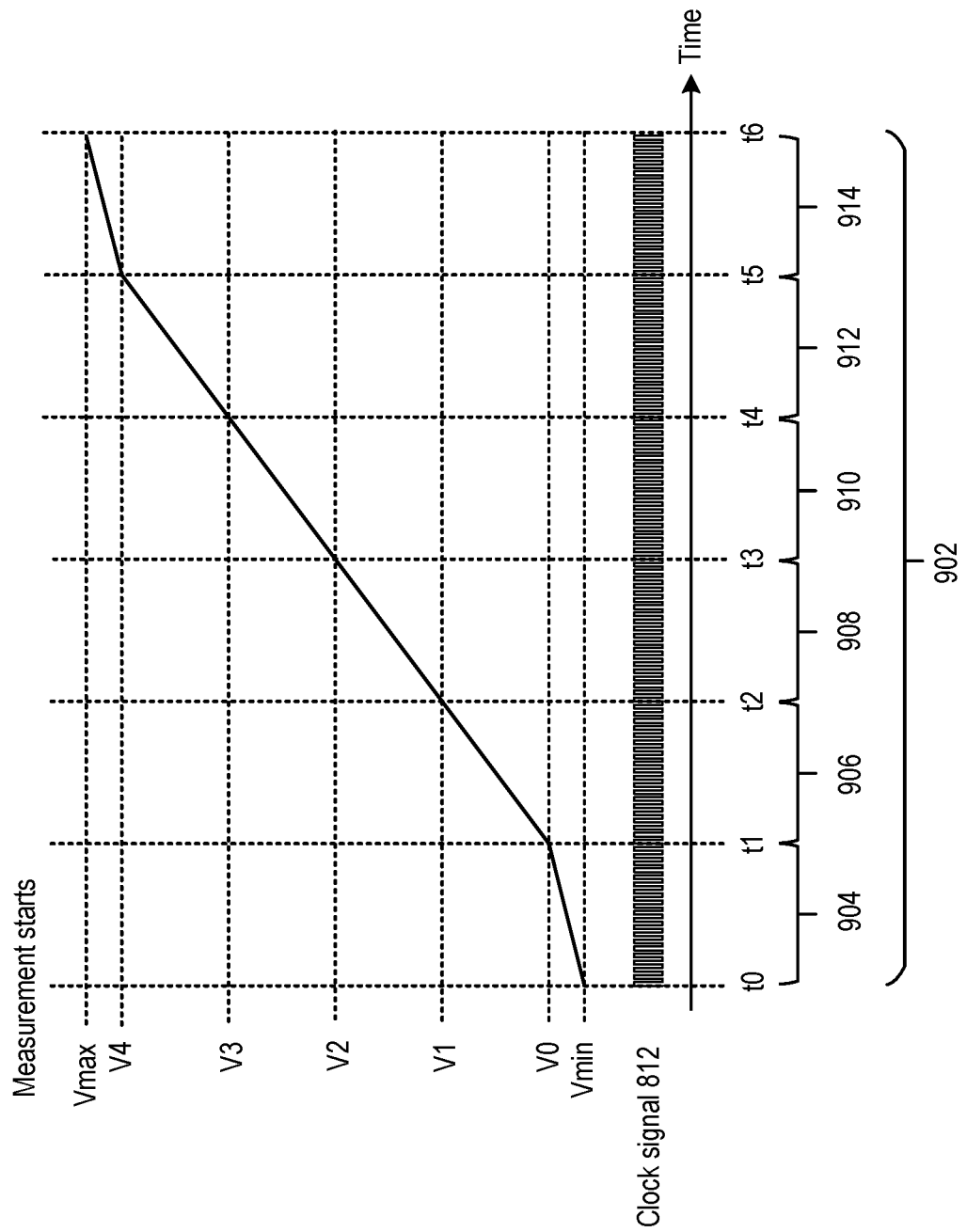

FIG. 11C illustrates another example of an non-uniform quantization scheme which pixel ADC 610 can be programmed to perform for the static voltage measurement mode of FIG. 8B. The non-uniform quantization scheme can be performed for the gaze determination operation of FIG. 7F. As shown in FIG. 11C, the ramp rate of VREF 815 for quantization operation subranges 904 and 914 can be made the smallest to provide the highest quantization resolution for those subranges. The programming can be based on, for example, light for glint patch 792 is likely to be quantized within quantization subrange 914, and light for pupil patch 794 is likely to be quantized within quantization subrange 904.

Figure 12:
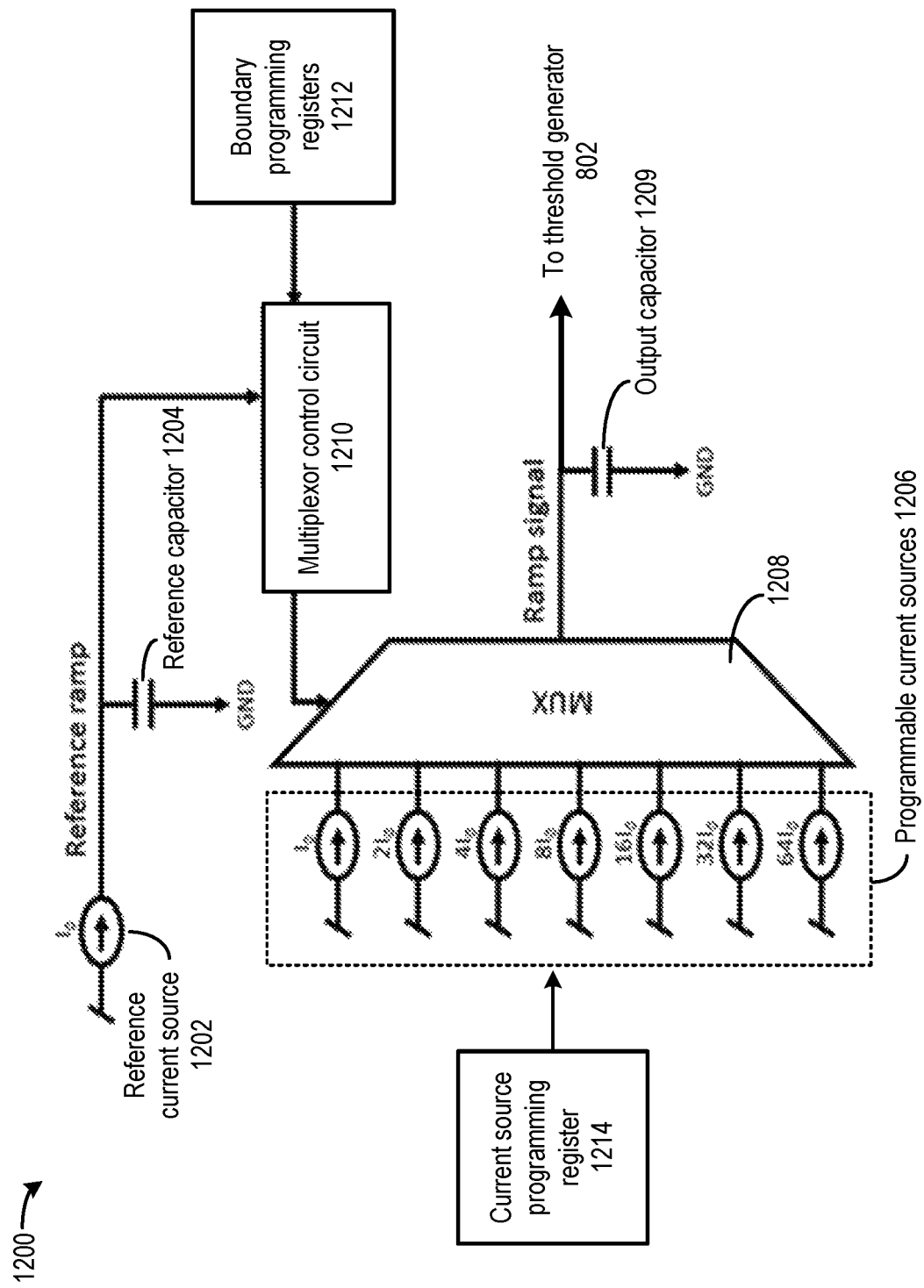
FIG. 12 illustrate an example of a voltage ramp modulation system for implementing the example techniques of FIGS. 11A, 11B, and 11C.

FIG. 12 illustrates an example of a voltage ramp modulation system 1200 that can be part of programmable configuration module 640 to support the non-uniform quantization schemes described in FIG. 11A and FIG. 11B. As shown in FIG. 12, voltage ramp modulation system 1200 includes a reference current source 1202, a reference capacitor 1204, a set of programmable current sources 1206, a multiplexor 1208, an output capacitor 1209, a multiplexor control circuit 1210, a voltage boundary programming register 1212, and a current source programming register 1214.

Programmable current sources 1206 can each be selected by multiplexor 1208 to inject a current into output capacitor 1209 to generate a voltage ramp, with the ramp rate being set by the selected programmable current source 1206. Each of programmable current sources 1206 can be selected to generate a voltage ramp for a quantization operation subrange of FIG. 11A and FIG. 11B. The voltage ramp generated at the output capacitor 1209 can be provided to threshold generator 802 to be output as ramping VREF 815. The ramp rate can be programmable via current source programming register 1214, which can set a quantity of current output by each of programmable current sources 1206, to set the voltage ramp rate for each quantization operation subrange.

In addition, reference current source 1202 can inject a reference current into reference capacitor 1204 to generate a reference ramp at a reference ramp rate. The reference ramp can be compared, at multiplexor control circuit 1210, against a set of threshold voltages provided by boundary programming registers 1212 to determine a current operation quantization subrange. Multiplexor control circuit 1210 can include a set of voltage comparators to compare the reference ramp against a set of threshold voltages representing a set of time boundaries of quantization operation subranges (e.g., t0, t1, t2, etc. of FIG. 9A and FIG. 9B) and mapped to the set of voltage boundaries of the quantization operation subranges (e.g., V0, V1, V2, etc. of FIG. 9A and FIG. 9B). Multiplexor control circuit 1210 also includes logic circuits which can translate the outputs of the set of comparators to a decision of the current quantization operation range, and a corresponding selection input to multiplexor 1208 to select one of the set of programmable current sources 1206 to inject current into output capacitor 1209 to generate the ramping VREF 815. Although not shown in FIG. 12, it is understood that the output of voltage ramp modulation system 1200 can be multiplexed with a fixed voltage source (which generates a flat VREF 815) so that either a ramping VREF 815 or a flat VREF 815 can be provided based on whether the ADC operates in the static voltage measurement mode or in the time-to-saturation measurement mode.

In some examples, programmable configuration module 640 can include both clock modulation system 1000 and voltage ramp modulation system 1200, to allow both the clock period of clock signal 812 and the ramp rate of VREF 815 to be variable for different quantization operation subranges, to allow both the clock period and the ramp rate to be set to achieve a particular quantization step size. Such arrangements allow the clock period to be set at a relatively high value to achieve that particular quantization step size (while the ramp rate is reduced), which can relax the requirements on the clock frequency and the resolution of the DAC. A high frequency clock (to reduce clock period) can introduce high jitter and require high power for transmission and distribution. By relaxing the requirement on the clock frequency, quantization resolution can be improved with a lower cost in terms of clock jitter and power.

Figure 13:
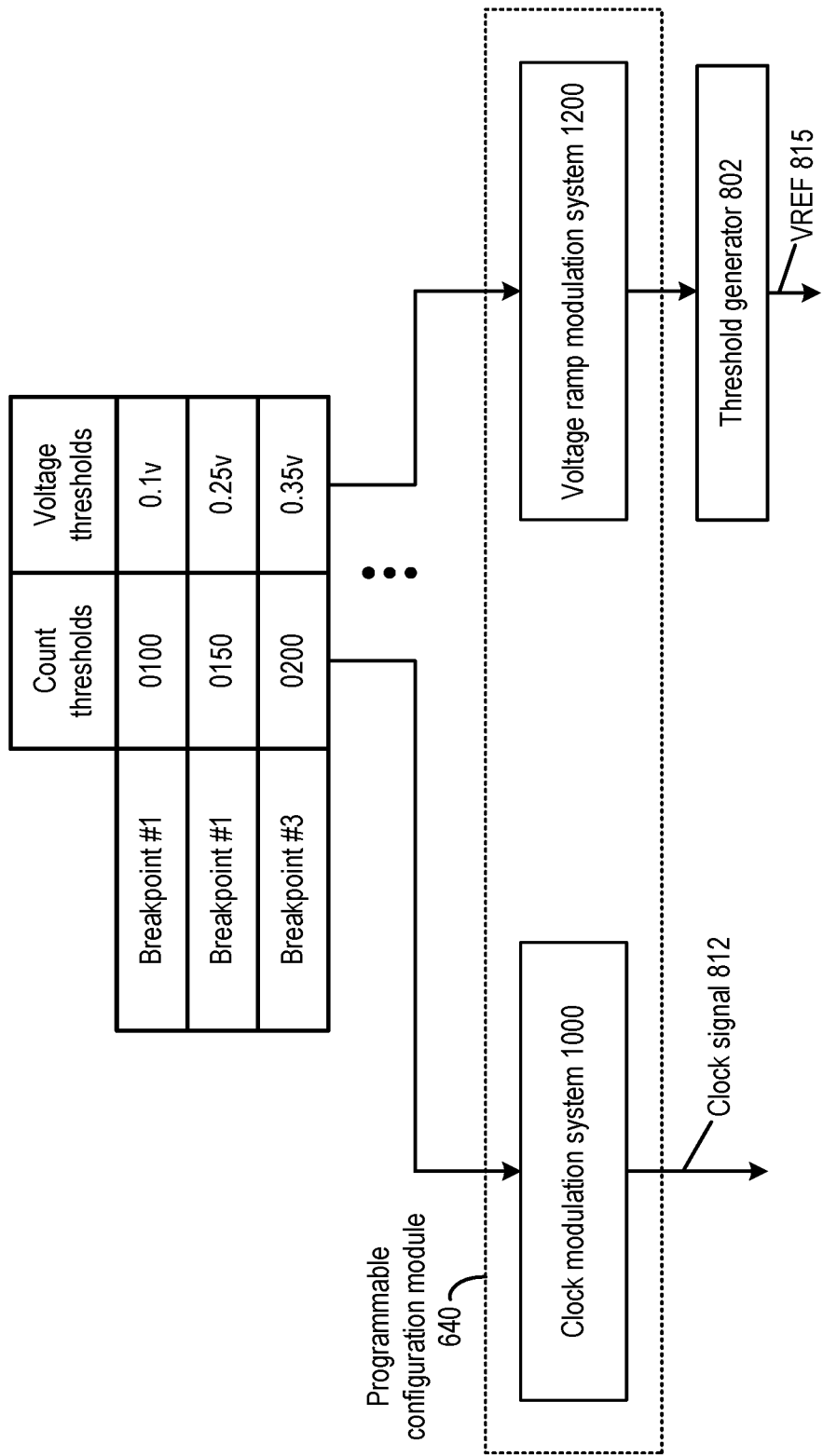
FIG. 13 illustrates an example of configuring the pixel cell of FIG. 6 to perform quantization using techniques described in FIG. 9A to FIG. 12.

FIG. 13 illustrates an example of programmable configuration module 640 that includes both clock modulation system 1000 and voltage ramp modulation system 1200. As shown in FIG. 13, the programming information of programmable configuration module 640 can include a set of breakpoints, with each breakpoint being associated with a count threshold for the reference count of reference counter 1004 of clock modulation system 1000 and a voltage threshold for the reference ramp of voltage ramp modulation system 1200. As both clock modulation system 1000 and voltage ramp modulation system 1200 operates, each of them checks the relevant threshold information (e.g., clock modulation system 1000 checks the count threshold, voltage ramp modulation system 1200 checks the voltage threshold, etc.) associated with a breakpoint to determine a current quantization operation subrange, and to adjust the clock period of clock signal 812 and the ramp rate of VREF 815.

Figure 14:
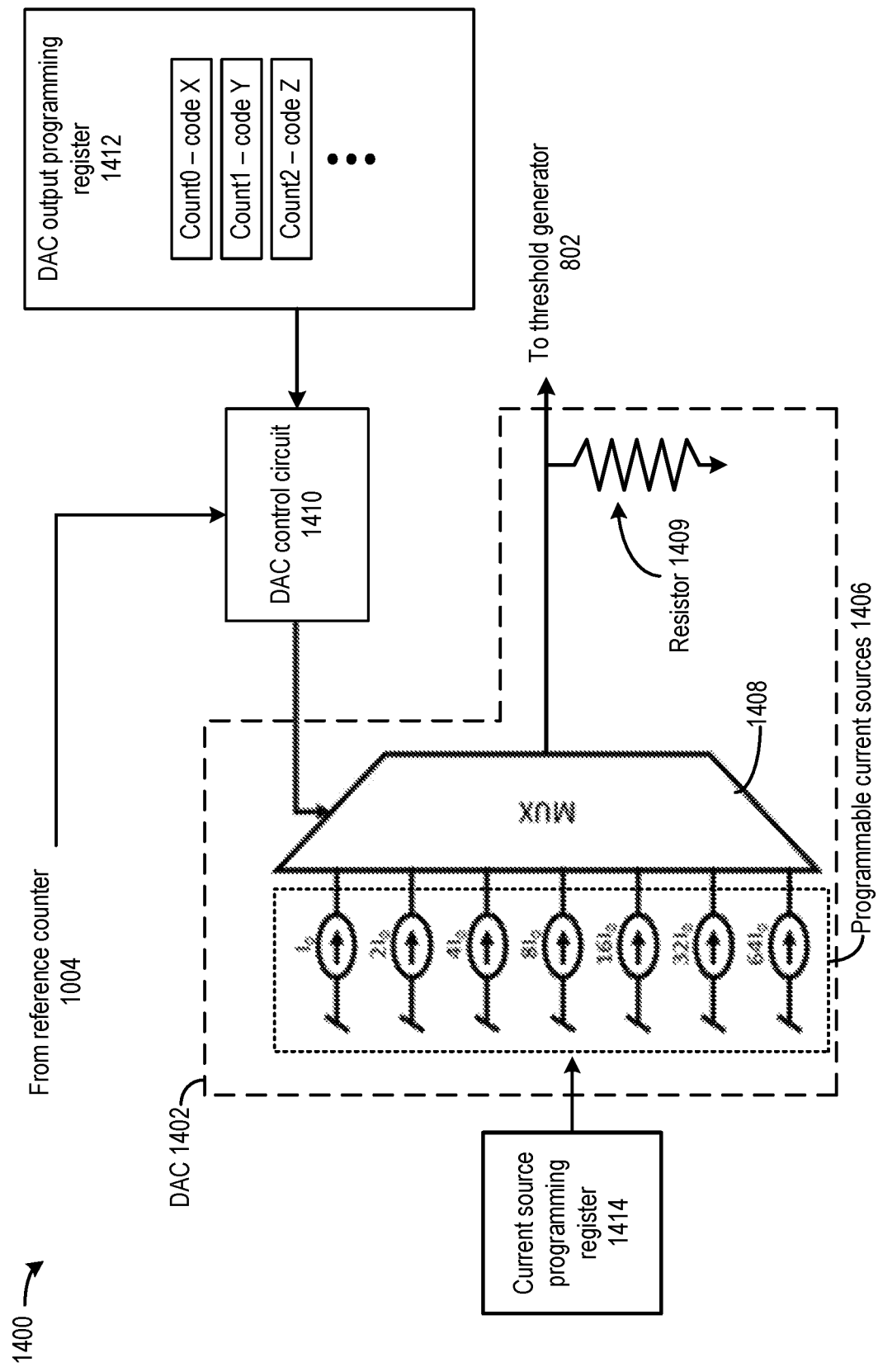
FIG. 14 illustrates an example of a digital to analog converter (DAC) for performing quantization.

In some examples, a voltage ramp modulation system can also be implemented using a DAC. FIG. 14 illustrates an example of voltage ramp modulation system 1400 that can be part of programmable configuration module 640. As shown in FIG. 14, voltage ramp modulation system 1400 includes a DAC 1402 comprising a set of programmable current sources 1406, a multiplexor 1408, and an output resistor 1409. Voltage ramp modulation system 1400 further includes a DAC control circuit 1410, a DAC output programming register 1412, and a current source programming register 1414. Multiplexor 1408 can be controlled by DAC control circuit 1410 to select one or more of programmable current sources 1406, which can combine to inject an aggregate current through resistor 1409 to develop a voltage. DAC control circuit 1410 can control multiplexor 1408 to select different sets of programmable current sources 1406 to generate a ramping voltage VREF 815. Although not shown in FIG. 14, it is understood that the output of voltage ramp modulation system 1400 can be multiplexed with a fixed voltage source (which generates a flat VREF 815) so that either a ramping VREF 815 or a flat VREF 815 can be provided based on whether the ADC operates in the static voltage measurement mode or in the time-to-saturation measurement mode.

DAC control circuit 1410 can receive programming information from boundary programming register 1412, which can include a sequence of code patterns to control DAC 1402 to generate a voltage ramp. For example, boundary programming register 1412 can store a sequence of threshold counts, with each threshold count (e.g., count0, count1, count2, etc.) being associated with a DAC code (e.g., code X, code Y, code Z, etc.). The threshold counts can be compared with a reference counter output (e.g., reference counter 1004 of FIG. 10) to provide a measurement of time, based on which DAC control circuit 1410 can set the output voltage to achieve a pre-determined voltage ramp rate, whereas the codes can be provided to multiplexor 1408 to select one or more of programmable current sources 1406 to set the output voltage. DAC control circuit 1410 can receive an updated count from the reference counter for each clock period of a reference clock and compare the count against the threshold counts to determine a code, and provide the code to multiplexor 1408 of DAC 1402 to generate a voltage of ramping voltage VREF 815. Current source programming register 1414 can also program the set of programmable current sources 1406 by setting a quantity of current output by each of the current sources, to set the voltage ramp rate for each quantization operation subrange.

Figure 15:
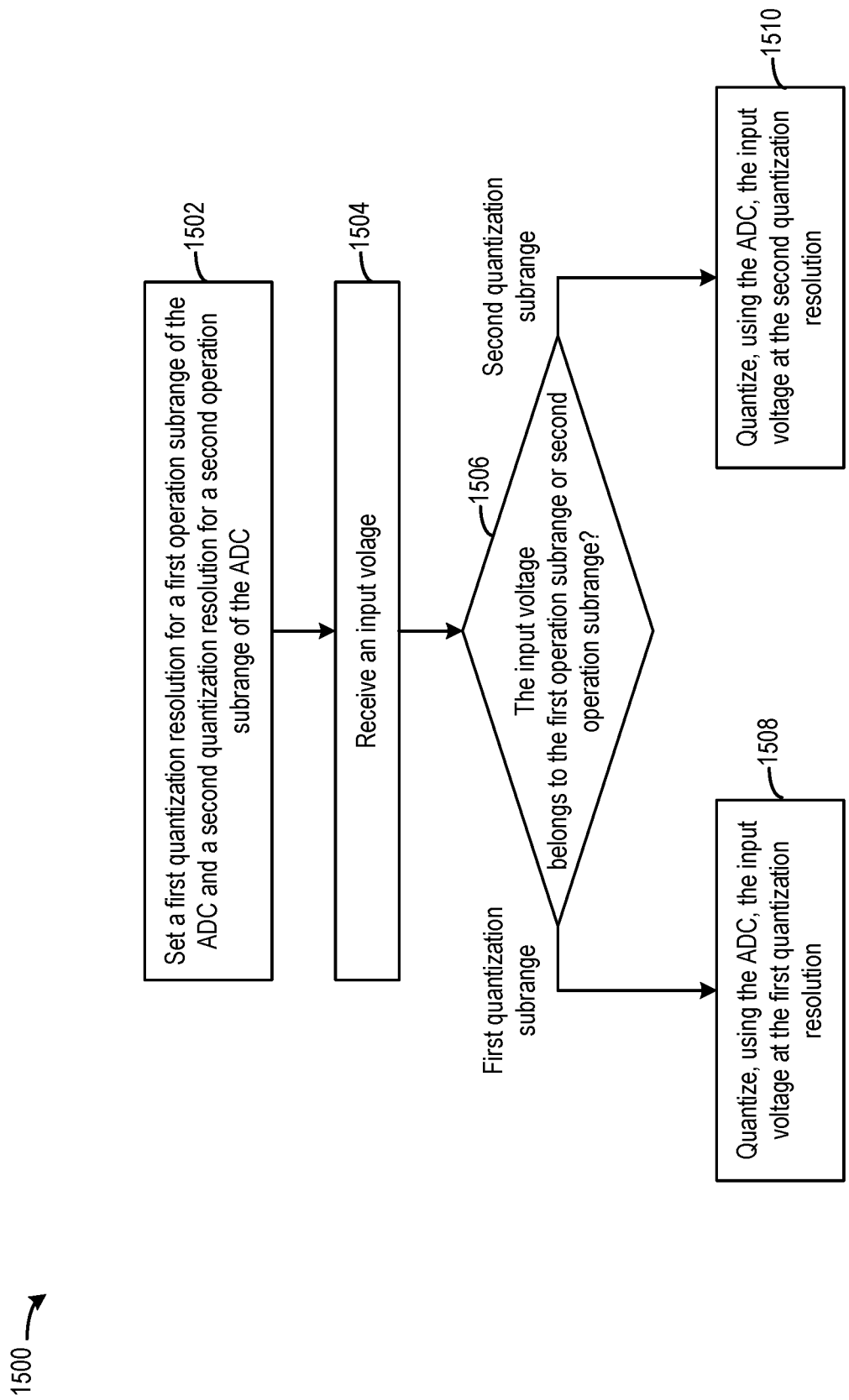
FIG. 15 illustrates an embodiment of a flowchart of a process for performing quantization.

FIG. 15 illustrates an embodiment of a flowchart of a process 1500 for quantizing an analog input (e.g., analog output voltage of a pixel cell) into a digital output. Process 1500 can be performed by an analog-to-digital converter (ADC), such as pixel ADC 610, in conjunction with programmable configuration module 640 that allows pixel ADC 610 to perform a non-uniform quantization process. The programmable components may include, for example, clock modulation system 1000 of FIG. 10, voltage ramp modulation system 1200 of FIG. 12, voltage ramp modulation system 1400 of FIG. 14, etc.

Process 1500 starts with step 1502, in which programmable configuration module 640 sets a first quantization resolution for a first operation subrange of the ADC and a second quantization resolution for a second operation subrange of the ADC. The ADC can perform quantization based on comparing the analog input voltage with a reference voltage ramp, and the digital output can be generated by a counter that measures the time for the reference voltage ramp to cross the analog input voltage. In some examples, the setting of the quantization resolution can be based on defining the clock frequencies of a clock to the counter for different operation subranges, as in clock modulation system 1000. In some examples, the setting of the quantization resolution can be based on defining the reference voltage ramp rate for different operation subranges, as in voltage ramp modulation system 1200. In some examples, both the voltage ramp rate and clock frequency can be defined for different operation subranges, as described in FIG. 13. In some examples, different DAC codes can be defined to set the reference voltages for different operation subranges, as in voltage ramp modulation system 1400.

In step 1504, the ADC can receive an input voltage. The input voltage can be provided by, for example, buffer 609 and measurement capacitor 608 representing a quantity of charge generated by photodiode 602 within an exposure period.

In step 1506, the ADC can determine whether the input voltage belongs to the first operation subrange or the second operation subrange. The determination can be based on comparing the input voltage with a first reference ramp voltage corresponding to the first quantization subrange and with a second reference ramp voltage corresponding to the second quantization subrange at different times.

If the input voltage belongs to the first operation subrange, the ADC can quantization the input voltage at the first quantization resolution, in step 1508. For example, the ADC can quantization the input voltage by measuring the time for the reference voltage ramp to cross the input voltage at a first clock rate, by setting the reference voltage ramp to a first ramp rate (based on capacitor or a DAC), etc.

If the input voltage belongs to the second operation subrange, the ADC can quantization the input voltage at the second quantization resolution, in step 1510. For example, the ADC can quantization the input voltage by measuring the time for the reference voltage ramp to cross the input voltage at a second clock rate, by setting the reference voltage ramp to a second ramp rate (based on capacitor or a DAC), etc.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. An analog-to-digital converter (ADC) comprising a quantizer, the quantizer having a first quantization resolution for a first quantization operation subrange and a second quantization resolution for a second quantization operation subrange,
    wherein both of the first quantization resolution and the first quantization operation subrange is programmable;
    wherein both of the second quantization resolution and the second quantization operation subrange is programmable; and
    wherein the quantizer is configured to:
        receive an input voltage; and
        based on whether the input voltage belongs to the first quantization operation subrange or to the second quantization operation subrange, quantize the input voltage at the first quantization resolution or at the second quantization resolution to generate a digital output.

2. The ADC of claim 1, wherein the quantizer is further configured to receive programming information, wherein the programming information defines the first quantization operation subrange, the second quantization operation subrange, the first quantization resolution for the first quantization operation subrange, and the second quantization resolution for the second quantization operation subrange; and
    wherein the quantizer is programmed based on the programming information.

3. The ADC of claim 2, wherein the quantizer comprises:
    a threshold generator configured to provide a threshold voltage ramp, where in the threshold voltage ramp starts at a reference time;
    a quantization comparator configured to compare the input voltage with threshold voltage ramp; and
    a digital time measurement circuit configured to generate, based on an input clock signal, a measurement of a time duration elapsed between the reference time and a crossover time when a voltage of the threshold voltage ramp matches the input voltage;
    wherein the digital output is generated based on the measurement of the time duration;
    wherein the first quantization operation subrange and the second quantization operation subrange are defined based on at least one of: time durations elapsed from the reference time, or voltages of the threshold voltage ramp; and
    wherein the first quantization resolution and the second quantization resolution are defined based on at least one of: a frequency of the input clock signal within the time durations, or a ramp rate of the threshold voltage ramp between the voltages.

4. The ADC of claim 3, wherein the digital time measurement circuit includes a first counter configured to generate a first count value based on counting a number of clock cycles of the input clock signal, the first count value corresponding to the measurement of the time duration between the reference time and the crossover time;

wherein the quantizer is configured to receive, based on the programming information, a first control signal at a first time and a second control signal at a second time;

wherein the first control signal comprises a first clock signal of a first clock frequency provided to the first counter as the input clock signal for the first quantization operation subrange, the first clock frequency being set based on the first quantization resolution;

wherein the second control signal comprises a second clock signal of a second clock frequency provided to the first counter as the input clock signal for the second quantization operation subrange, the second clock frequency being set based on the second quantization resolution;

wherein the first time defines the first quantization operation subrange;

wherein the second time defines the second quantization operation subrange; and wherein the crossover time is within one of the first time or the second time.

5. The ADC of claim 4, further comprising a reference counter configured to generate a reference count value based on counting a number of clock cycles of a reference input clock;

wherein the quantizer is configured to receive the first clock signal between when the reference count value equals a first threshold count corresponding to start of the first time;

wherein the quantizer is configured to receive the second clock signal when the reference count value equals a second threshold count corresponding to start of the second time; and wherein the first threshold count and the second threshold count are included in the programming information.

6. The ADC of claim 5, further comprising a first comparator, a second comparator, a first clock generator, a second clock generator, and a selection circuit;

wherein the first clock generator is configured to generate the first clock signal;

wherein the second clock generator is configured to generate the second clock signal;

wherein the first comparator is configured to generate a first comparison result based on comparing the reference count value against the first threshold count;

wherein the second comparator is configured to generate a second comparison result based on comparing the reference count value against the second threshold count; and wherein the selection circuit is configured to select, based on the first comparison result and the second comparison result, one of the first clock signal from the first clock generator or the second clock signal from the second clock generator for outputting to the digital time measurement circuit of the quantizer.

7. The ADC of claim 6, wherein at least one of: the reference counter, the first comparator, the second comparator, the first clock generator, the second clock generator, or the selection circuit is external to the quantizer.

8. The ADC of claim 3, wherein the quantizer is configured to receive, based on the programming information, a first control signal at a first time and a second control signal at a second time;

wherein the first control signal comprises a first voltage ramp between a first voltage and a second voltage provided to the threshold generator to be output as the threshold voltage ramp for the first quantization operation subrange, the first voltage ramp having a first ramp rate, the first ramp rate being set based on the first quantization resolution;

wherein the second control signal comprises a second voltage ramp between a third voltage and a fourth voltage provided to the threshold generator to be output as the threshold voltage ramp for the second quantization operation subrange, the second voltage ramp having a second ramp rate, the second ramp rate being set based on the second quantization resolution;

wherein the first voltage and the second voltage define the first quantization operation subrange;

wherein the third voltage and the fourth voltage define the second quantization operation subrange; and wherein the input voltage is between the first voltage and the second voltage or between the third voltage and the fourth voltage.

9. The ADC of claim 8, further comprising a reference ramp generator configured to generate a reference ramp;

wherein the quantizer is configured to receive a voltage based on the first voltage ramp when a voltage of the reference ramp equals a first threshold voltage;

wherein the quantizer is configured to receive a voltage based on the second voltage ramp when a voltage of the reference ramp equals a second threshold voltage; and wherein the first threshold voltage and the second threshold voltage are included in the programming information.

10. The ADC of claim 9, further comprising a first comparator, a second comparator, a first ramp generator, a second ramp generator, and a selection circuit;

wherein the first ramp generator is configured to generate the first voltage ramp;

wherein the second ramp generator is configured to generate the second voltage ramp;

wherein the first comparator is configured to generate a first comparison result based on comparing a voltage of the reference ramp against the first threshold voltage;

wherein the second comparator is configured to generate a second comparison result based on comparing a voltage of the reference ramp against the second threshold voltage; and wherein the selection circuit is configured to select, based on the first comparison result and the second comparison result, one of the first voltage ramp from the first ramp generator or the second voltage ramp from the second ramp generator for outputting to the threshold generator of the quantizer.

11. The ADC of claim 10, wherein:

the reference ramp generator includes a reference current source and a first capacitor, the reference current source being configured to deposit charges at the first capacitor to generate the reference ramp;

the first ramp generator includes a first current source;

the second ramp generator includes a second current source; and the selection circuit is coupled with a second capacitor and configured to select, based on the first comparison result and the second comparison result, one of the first current source or the second current source to deposit charges at the second capacitor to output the first voltage ramp or the second voltage ramp to the threshold generator of the quantizer.

12. The ADC of claim 11, wherein at least one of: the reference ramp generator, the first comparator, the second comparator, the first ramp generator, the second ramp generator, or the selection circuit is external to the quantizer.

13. The ADC of claim 3, further comprising a configurable current source and a resistor;
   wherein the configurable current source is configured to supply a current to the resistor to develop a voltage;
   wherein the current supplied by the configurable current source is configured based on a sequence of patterns to control the configurable current source to generate the threshold voltage ramp at a first voltage ramp rate within a first time and at a second voltage ramp rate within a second time; and
   wherein the sequence of patterns is included in the programming information.

14. The ADC of claim 3, wherein the programming information defines a first voltage ramp rate for the threshold voltage ramp and a first clock frequency for the input clock signal to set the first quantization resolution; and
   wherein the programming information further defines a second voltage ramp rate for the threshold voltage ramp and a second clock frequency for the input clock signal to set the second quantization resolution.

15. The ADC of claim 1, wherein the quantizer is configured to:
   between a first time and a second time, compare the input voltage against a first ramping voltage to perform a first time measurement of when the first ramping voltage intersects the input voltage;
   between a third time and a fourth time, compare the input voltage against a second ramping voltage to perform a second time measurement of when the second ramping voltage intersects the input voltage;
   wherein the digital output is generated based on a result of one of the first time measurement or the second time measurement;
   wherein the first quantization operation subrange is set base on setting the first time and the second time;
   wherein the second quantization operation subrange is set base on setting the third time and the fourth time;
   wherein the first quantization resolution is set based on setting at least one of: a ramp rate of the first ramping voltage or a resolution of the first time measurement; and
   wherein the second quantization resolution is set based on setting at least one of: a ramp rate of the second ramping voltage or a resolution of the second time measurement.

16. The ADC of claim 15, further comprising a counter to perform the first time measurement and the second time measurement; and
   wherein the resolutions of the first time measurement and the second time measurement are set based on setting a frequency of an input clock signal to the counter.

17. A pixel cell array comprising:
   a first photodiode;
   a second photodiode; and
   an analog-to-digital converter (ADC) comprising a quantizer, the quantizer having a first quantization resolution for a first quantization operation subrange and a second quantization resolution for a second quantization operation subrange, both of the first quantization resolution and the first quantization operation subrange being programmable, both of the second quantization resolution and the second quantization operation subrange being programmable; and
   wherein the quantizer of the ADC is configured to:
      receive a first voltage representing a first quantity of charge generated by the first photodiode;
      based on whether the first voltage belongs to the first quantization operation subrange or to the second quantization operation subrange, quantize the first voltage at the first quantization resolution or at the second quantization resolution to generate a first digital output to represent an intensity of light received by the first photodiode;
      receive a second voltage representing a second quantity of charge generated by the second photodiode; and
      based on whether the second voltage belongs to the first quantization operation subrange or to the second quantization operation subrange, quantize the second voltage at the first quantization resolution or at the second quantization resolution to generate a second digital output to represent an intensity of light received by the second photodiode.

18. The pixel cell array of claim 17, wherein the first quantization resolution and the second quantization resolution are set at a first value at a first time and a second value different from the first value at a second time.

19. The pixel cell array of claim 17, wherein the first quantization resolution and the second quantization resolution are set for quantizing a range of measurements corresponding to a common intensity range of light; and
   wherein the first quantization resolution has a different value from the second quantization resolution; and
   wherein the first quantization resolution and the second quantization resolution are set based on, respectively, a first location of the first photodiode and a second location of the second photodiode within the pixel cell array.

20. The pixel cell array of claim 17, wherein:
   the ADC comprises a first counter and a second counter;
   the first counter and the second counter are configured to convert a measurement of an intensity of light received at the first photodiode and at the second photodiode into a measurement of time to generate, respectively, the first digital output and the second digital output;
   the first quantization resolution is set based on setting a first input clock to the first counter at a first clock frequency; and
   the second quantization resolution is set based on setting a second input clock to the second counter at a second clock frequency.

21. The pixel cell array of claim 17, wherein:
   the ADC comprises a first comparator and a second comparator;
   the first comparator is configured to compare a first voltage representing an intensity of light received at the first photodiode against a first voltage ramp having a first ramp rate;
   the second comparator is configured to compare a second voltage representing an intensity of light received at the second photodiode against a second voltage ramp having a second ramp rate;
   the first quantization resolution is set based on setting the first ramp rate; and
   the second quantization resolution is set based on setting the second ramp rate.

* * * * *